United States Patent
Lung

(10) Patent No.: US 7,534,647 B2
(45) Date of Patent: May 19, 2009

(54) DAMASCENE PHASE CHANGE RAM AND MANUFACTURING METHOD

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 25 days.

(21) Appl. No.: 11/677,354

(22) Filed: Feb. 21, 2007

(65) Prior Publication Data

US 2007/0138458 A1   Jun. 21, 2007

Related U.S. Application Data

(63) Continuation-in-part of application No. 11/155,067, filed on Jun. 17, 2005, now Pat. No. 7,321,130.

(51) Int. Cl.
*H01L 21/00* (2006.01)

(52) U.S. Cl. .................. 438/95; 438/102; 438/197; 257/2; 257/E29.17; 257/E27.004

(58) Field of Classification Search .............. 438/102, 438/95; 257/2
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,534,712 A | 7/1996 | Ovshinsky et al. | |
| 5,687,112 A | 11/1997 | Ovshinsky | |
| 5,789,277 A | 8/1998 | Zahorik et al. | |

(Continued)

FOREIGN PATENT DOCUMENTS

WO    WO 00/45108 A1    8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—W. David Coleman
*Assistant Examiner*—Shaka Scarlett
(74) *Attorney, Agent, or Firm*—Haynes Beffel & Wolfeld LLP

(57) ABSTRACT

A method for manufacturing a memory device uses a damascene process to define memory elements. The device comprises a first electrode having a top side, a second electrode having a top side and an insulating member between the first electrode and the second electrode. The insulating member has a thickness between the first and second electrodes near the top side of the first electrode and the top side of the second electrode. A damascene patch crosses the insulating member aligned with the first and second electrodes, and defines an inter-electrode path between the first and second electrodes across the insulating member. An array of such memory cells is provided.

20 Claims, 20 Drawing Sheets

U.S. PATENT DOCUMENTS

| | | |
|---|---|---|
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,077,729 A | 6/2000 | Harshfield |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,569,705 B2 * | 5/2003 | Chiang et al. ............... 438/95 |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,563 B2 | 10/2004 | Xu |
| 6,815,704 B1 | 11/2004 | Chen |
| 6,859,389 B2 * | 2/2005 | Idehara ...................... 365/163 |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,305 B2 | 5/2005 | Yi et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen |
| 7,042,001 B2 | 5/2006 | Kim et al. |
| 7,132,675 B2 | 11/2006 | Gilton |
| 2004/0248339 A1 | 12/2004 | Lung |
| 2005/0093022 A1 | 5/2005 | Lung |
| 2005/0215009 A1 | 9/2005 | Cho |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/ENG/00M-04, Mar. 2000, 121 pages.

Chen, AN et al., "Non-Volatile Resistive Switching for Advanced Memory Applications," IEEE IEDM , Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3$^{rd}$ E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24 μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Non-volatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

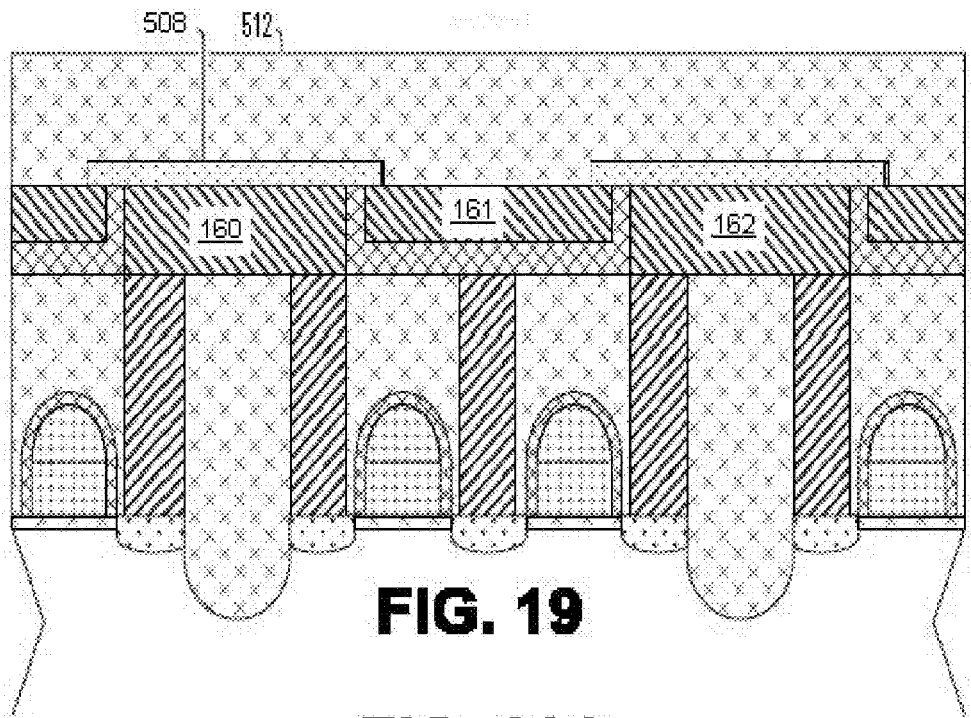
FIG. 19
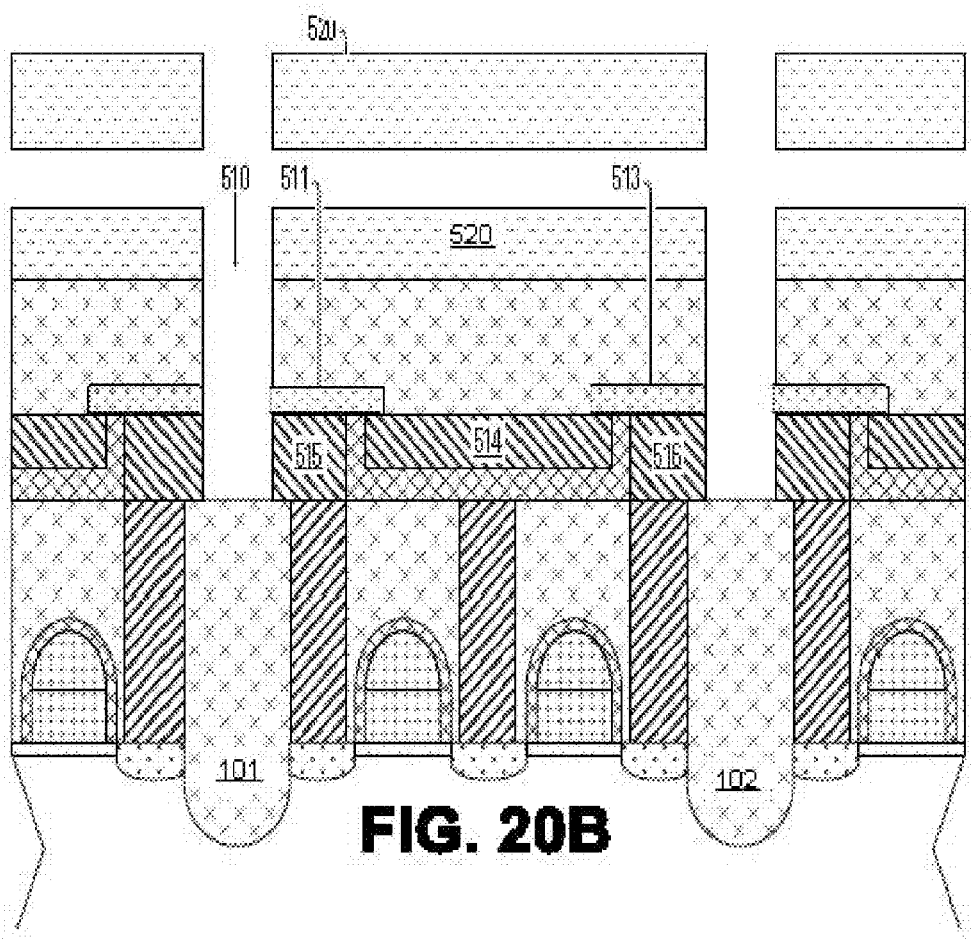
FIG. 20A
FIG. 20B

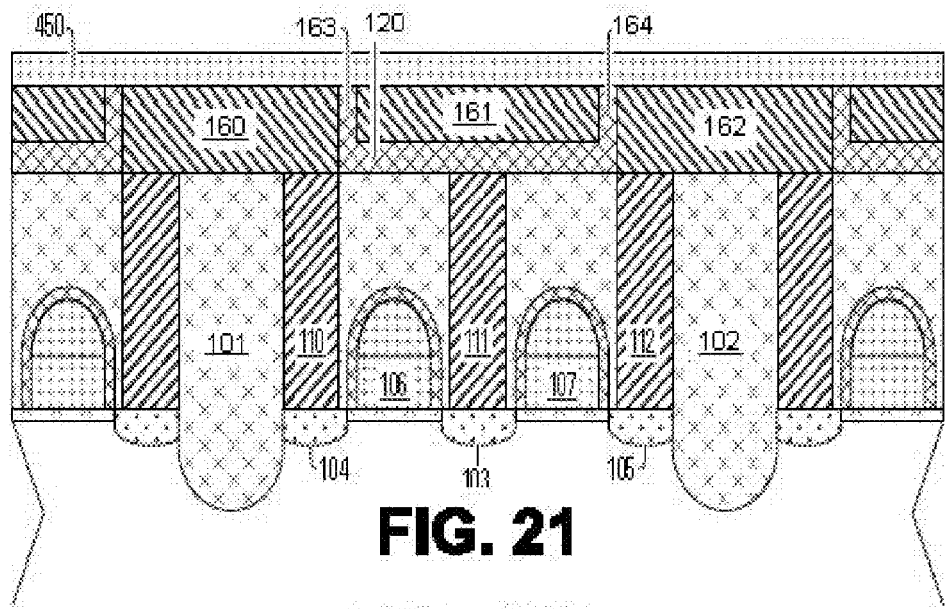
FIG. 21
FIG. 22A
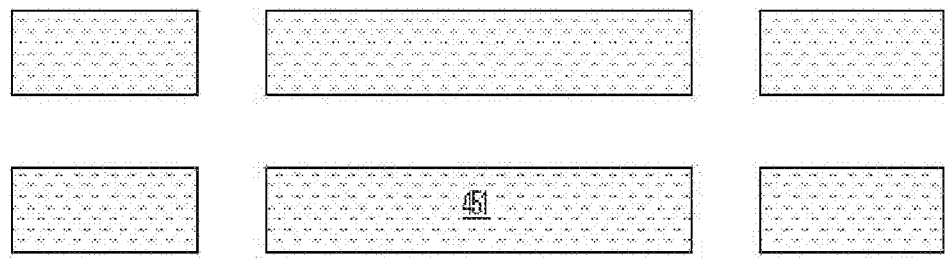
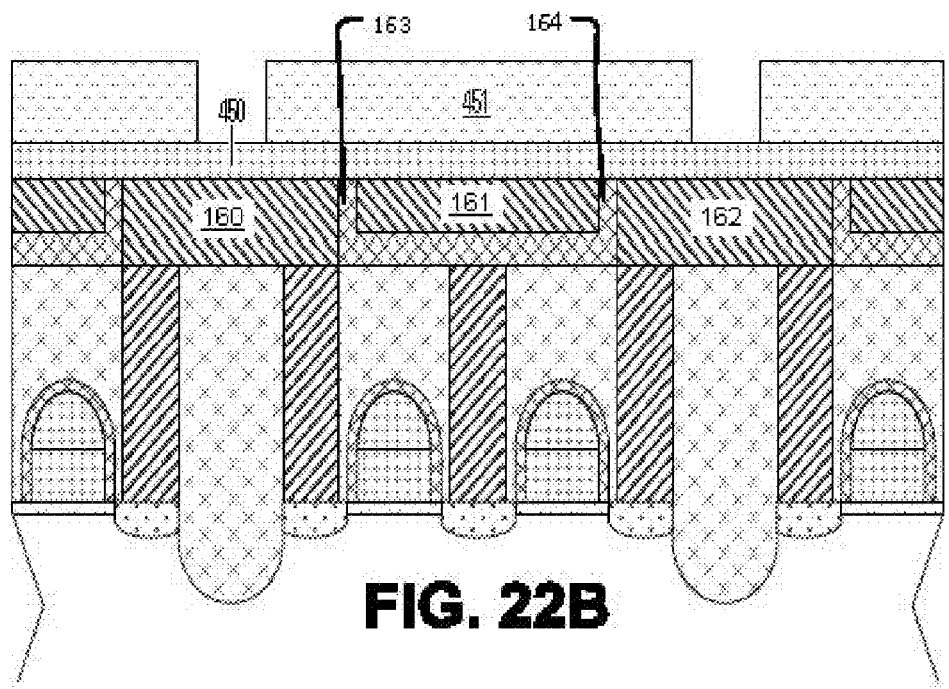
FIG. 22B

FIG. 23A
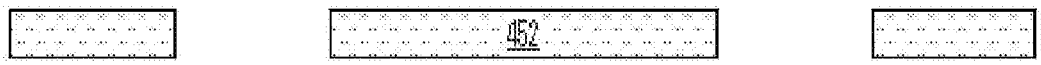
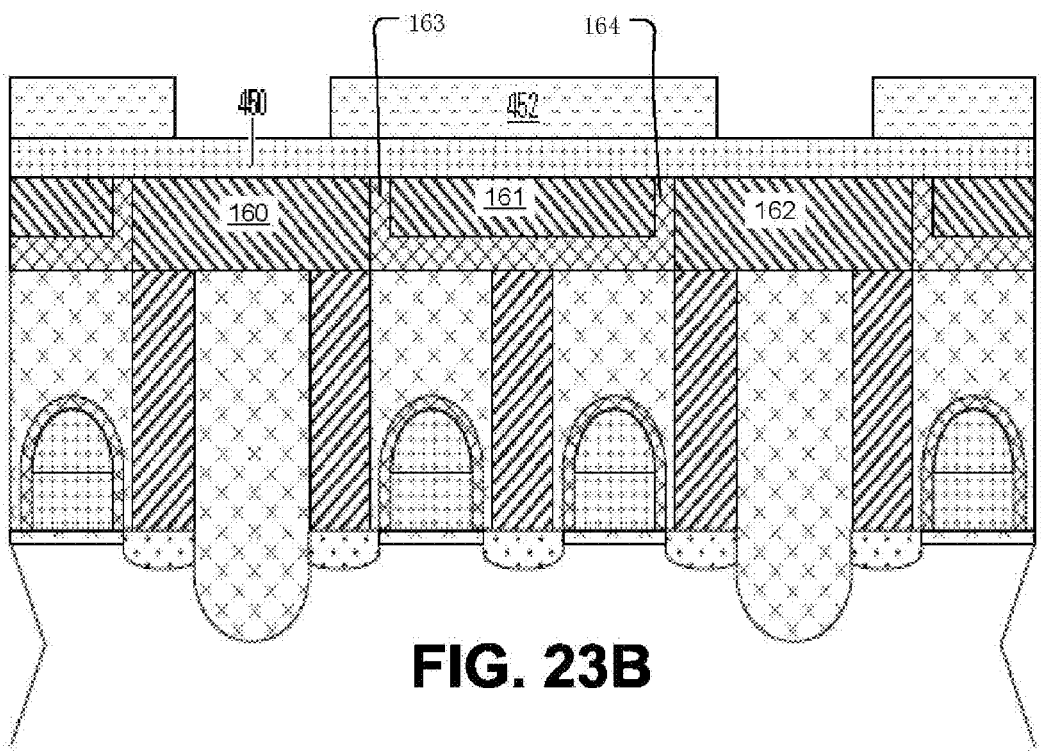
FIG. 23B

US 7,534,647 B2

DAMASCENE PHASE CHANGE RAM AND MANUFACTURING METHOD

RELATED APPLICATION DATA

The present application is a continuation-in-part of U.S. patent application Ser. No. 11/155,067; filed 17 Jun. 2005, which is incorporated by reference as if fully set forth herein.

PARTIES TO A JOINT RESEARCH AGREEMENT

International Business Machines Corporation, a New York corporation; Macronix International Corporation, Ltd., a Taiwan corporation, and Infineon Technologies A. G., a German corporation, are parties to a Joint Research Agreement.

BACKGROUND OF THE INVENTION

1. Field of the Invention

The present invention relates to high density memory devices based on phase change based memory materials, including chalcogenide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

It has also been found that etch chemistries applied to patterning phase change material can damage surface layers of the material, by causing components of the phase change materials to be removed unevenly from the surface. It is desirable to protect the core regions of the phase change material from such damage.

Problems have arisen in manufacturing such devices with very small dimensions, and with variations in process that meets tight specifications needed for large-scale memory devices. It is desirable therefore to provide a memory cell structure having small dimensions and low reset currents, and a method for manufacturing such structure that meets tight process variation specifications needed for large-scale memory devices. It is further desirable to provide a manufacturing process and a structure, which are compatible with manufacturing of peripheral circuits on the same integrated circuit.

SUMMARY OF THE INVENTION

A phase change random access memory PCRAM device is described suitable for use in large-scale integrated circuits. Technology described herein includes a memory device comprising a first electrode having a top side, a second electrode having a top side and an insulating member between the first electrode and the second electrode. The insulating member has a thickness between the first and second electrodes near the top side of the first electrode and the top side of the second electrode. A damascene, thin film bridge crosses the insulating member, and defines an inter-electrode path between the first and second electrodes across the insulating member. The inter-electrode path across the insulating member has a path length defined by the width of the insulating member. The bridge comprises memory material having at least two solid phases that are reversible, such as a chalcogenide-based material or other related material, by applying a current through the material or applying a voltage across the first and second electrodes.

The volume of memory material subject of phase change can be very small, determined by the thickness of the insulating member (path length in the x-direction), the thickness of the thin film used to form the bridge (y-direction), and the width of the bridge orthogonal to the path length (z-direction). The thickness of the insulating member and the thickness of the thin film of memory material used to form the bridge are determined in embodiments of the technology by thin film thicknesses which are not limited by the lithographic processes used in manufacturing the memory cell. The width of the bridge is also smaller than a minimum feature size F that is specified for a lithographic process used in patterning the layer of material in embodiments of the present invention. Accordingly, a phase change memory cell with simple structure achieves very small reset current and low power consumption, and is easily manufactured.

In embodiments of the technology described herein, an array of memory cells is provided. In the array, a plurality of electrode members and insulating members therebetween comprise an electrode layer on an integrated circuit. The electrode layer has a top surface which is substantially planar in some embodiments of the invention. The corresponding plurality of thin film bridges across the insulating members between pairs of electrode members comprise memory elements on the top surface of the electrode layer. A current path from a first electrode in the electrode layer through a thin film bridge on the top surface of the electrode layer to a second electrode in the electrode layer is established for each memory cell in the array.

Circuitry below the electrode layer on integrated circuits described herein can be implemented using well understood technology for logic circuitry and memory array circuitry, such as CMOS technology. In one embodiment, an isolation device such as a transistor has a terminal beneath at least a second electrode in an electrode pair, and a conductor forms a connection between the terminal of the transistor and the second electrode for a memory cell in the array. According to a representative embodiment, the circuitry below the electrode layer includes a plurality of bias lines, such as common source conductors, and a plurality of isolation devices. The isolation devices in the plurality have a first terminal coupled to a bias line in the plurality of bias lines, a second terminal, and a conductor extending between the second terminal and the first electrode in the electrode layer of a corresponding memory cell in the array. In addition, a plurality of word lines is provided in the circuitry beneath the electrode layer. Word lines in the plurality are coupled with isolation devices for memory cells along respective rows in the array, so that control signals on the word lines control connection of memory cells along the respective rows to one of the bias lines in the plurality of bias lines. In one array embodiment described herein, bias lines in the plurality of bias lines are arranged adjacent corresponding pairs of rows in the array, and two rows of isolation devices in the plurality of isolation devices coupled with said corresponding pairs of rows of memory cells are coupled to a shared bias line in the plurality of bias lines.

Also, in one array embodiment described herein, circuitry above the electrode layer includes a plurality of bit lines. In an embodiment having bit lines above the electrode layer that is described herein, electrode members in the electrode layer which act as a first electrode for a memory cell are shared so that a single electrode member provides a first electrode for two memory cells in a column of the array. Also, in an embodiment that is described herein, bit lines in the plurality of bit lines are arranged along corresponding columns in the array, and two adjacent memory cells in the corresponding columns share a contact structure for contacting said first electrodes.

A method for manufacturing a memory device using a damascene technique to form the phase change element is described. The method comprises forming an electrode layer on a substrate which comprises circuitry made using front-end-of-line procedures. The electrode layer in this method has a top surface. The electrode layer includes a first electrode and a second electrode, and an insulating member between the first and second electrodes for each phase change memory cell to be formed. The first and second electrodes and the insulating member extend to the top surface of the electrode layer, and the insulating member has a width between the first and second electrodes at the top surface, as described above in connection with the phase change memory cell structures. The method also includes forming a bridge of memory material on the top surface of the electrode layer across the insulating member for each memory cell to be formed using a damascene process, that includes etching a trench in a layer of material over the electrodes, and filling the trench with memory material to form a damascene bridge. The bridge comprises a film of memory material having a first side and a second side and contacts the first and second electrodes on the first side. The bridge defines an inter-electrode path between the first and second electrodes across the insulating member having a path length defined by the width of the insulating member. In embodiments of the method, an access structure over the electrode layer is made by forming a patterned conductive layer over said bridge, and forming a contact between said first electrode and said patterned conductive layer.

In an embodiment described herein, a method for forming the damascene bridges includes:
  forming a layer of dielectric or other material over the electrode layer;
  etching an array of trenches in the layer of dielectric or other material;
  depositing a layer of memory material in the trenches in the array of trenches, to form an array of damascene patches of memory material on the top surface of the electrode layer, the array of damascene patches including patches for each of the electrode pairs in the array of electrode pairs, the damascene patches contacting the respective first and second electrodes and extending across the respective insulating members, the damascene patches comprising films of memory material having a first side and a second side and contacting the respective first and second electrodes on the first side, the damascene patches defining inter-electrode paths between the first and second electrodes across the insulating members, the inter-electrode paths having path lengths defined by the widths of the insulating members, wherein the memory material has at least two solid phases; and
  forming a patterned conductive layer over said patch, and forming an array of contacts between said first electrodes in the array of electrode pairs and said patterned conductive layer.

The methods described herein for formation of the damascene bridge for use in a memory cell in the PCRAM, can be used to make a very small bridge for other uses. Nano-technology devices with very small bridge structures are provided using programmable resistive materials other than phase change.

The technology described herein provides for formation of a phase change bridge, without exposing the phase change material close to the active region to etch chemistries that may damage the surface layers of the material, by applying a damascene fill and polish process which does not expose the core region of the bridge to etch or polish chemistries.

Other aspects and advantages of the invention can be seen for the drawings, the detailed description and the claims which follow.

BRIEF DESCRIPTION OF THE DRAWINGS

FIG. 19 illustrates a fifth step in a set of steps for manufacturing a bridge of memory material using a damascene procedure.

FIGS. 20A and 20B illustrate a sixth step in a set of steps for manufacturing a bridge of memory material using a damascene procedure.

FIG. 21 illustrates a first step in a set of steps for manufacturing a bridge of memory material using an alternative damascene procedure.

FIGS. 22A-22B illustrate a second step in a set of steps for manufacturing a bridge of memory material using an alternative damascene procedure.

FIGS. 23A-23B illustrate a third step in a set of steps for manufacturing a bridge of memory material using an alternative damascene procedure.

DETAILED DESCRIPTION

A detailed description of thin film fuse phase change memory cells, arrays of such memory cells, and methods for manufacturing such memory cells, is provided with reference to FIGS. 1-27.

Figure 1:
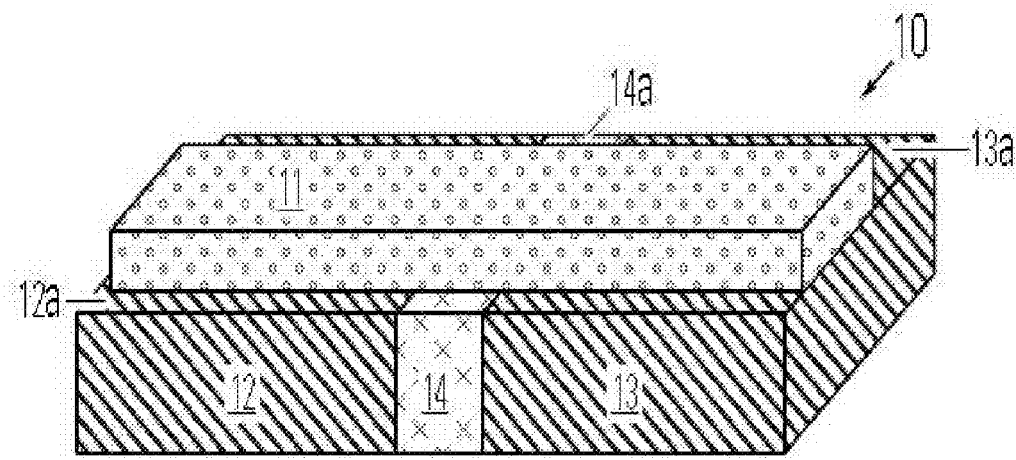
FIG. 1 illustrates an embodiment of a thin film bridge phase change memory element.

FIG. 1 illustrates a basic structure of a memory cell 10 including a bridge 11 of memory material on an electrode layer which comprises a first electrode 12, a second electrode 13, and an insulating member 14 between the first electrode 12 and the second electrode 13. As illustrated, the first and second electrodes 12, 13 have top surfaces 12a and 13a. Likewise the insulating member 14 has a top surface 14a. The top surfaces 12a, 13a, 14a of the structures in the electrode layer define a substantially planar top surface for the electrode layer in the illustrated embodiment. The bridge 11 of memory material lies on the planar top surface of the electrode layer, so that contacts between the first electrode 12 and the bridge 11 and between the second electrode 13 and the bridge 11 are made on the bottom side of the bridge 11.

Figure 2:
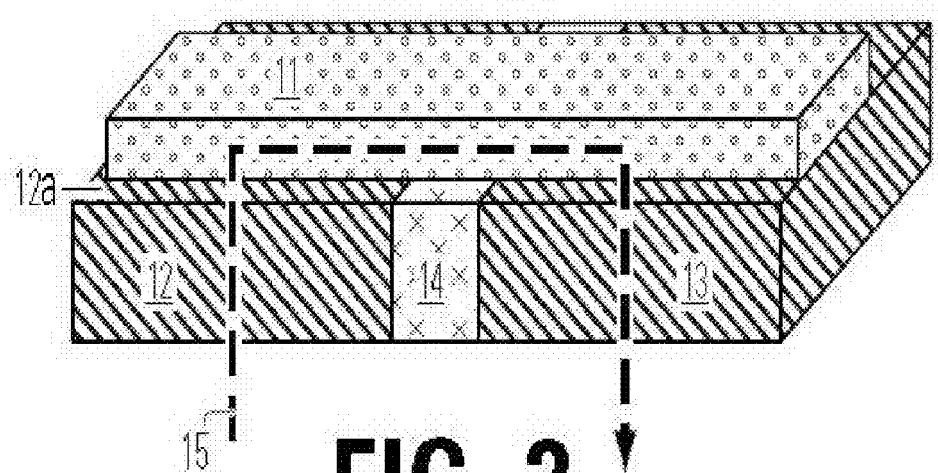
FIG. 2 illustrates a current path in a thin film bridge phase change memory element as shown in FIG. 1.

FIG. 2 shows a current path 15 between the first electrode 12, the bridge 11, and the second electrode 13 formed by the memory cell structure. Access circuitry can be implemented to contact the first electrode 12 and the second electrode 13 in a variety of configurations for controlling the operation of the memory cell, so that it can be programmed to set the bridge 11 in one of at least two solid phases that can be reversibly implemented using the memory material. For example, using a chalcogenide-based phase change memory material, the memory cell may be set to a relatively high resistivity state in which at least a portion of the bridge 11 in the current path 15 is an amorphous state, and may be set to a relatively low resistivity state in which most of the bridge 11 in the current path 16 is in a crystalline state.

Figure 3:
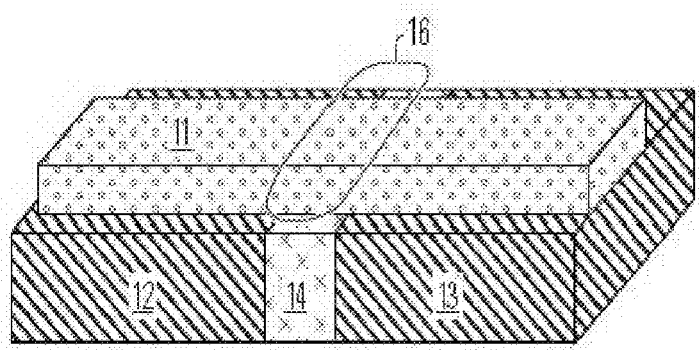
FIG. 3 illustrates an active region for phase changes in a thin film bridge phase change memory element as shown in FIG. 1.

FIG. 3 shows the active channel 16 in the bridge 11, where the active channel 16 is the region in which the memory material is induced to change between the at least two solid phases. As can be appreciated, the active channel 16 can be made extremely small in the illustrated structure, reducing the magnitude of current needed to induce the phase changes.

Figure 4:
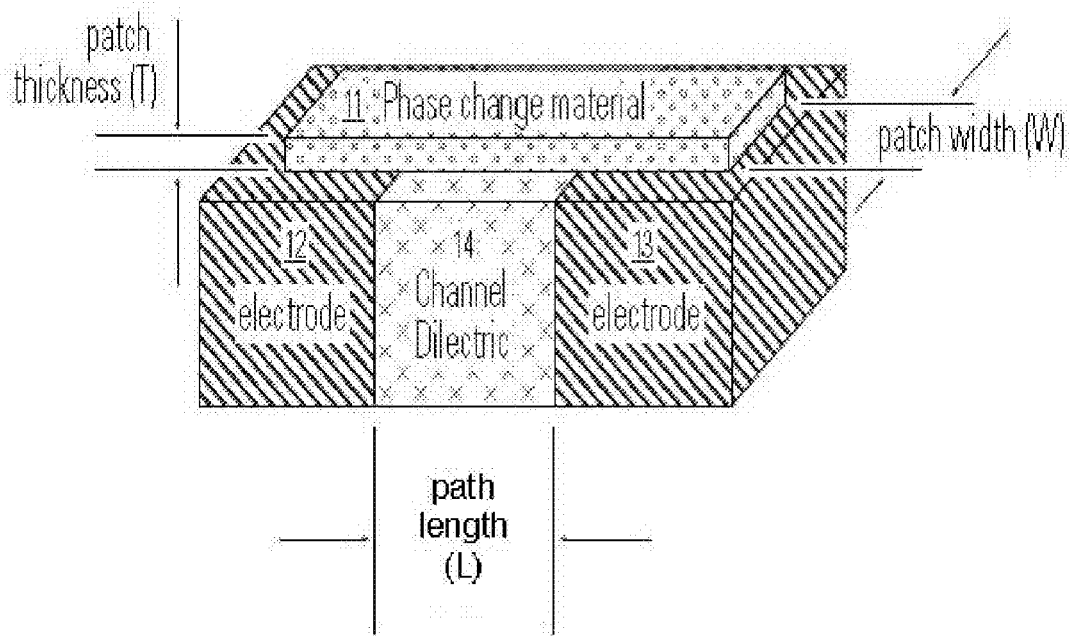
FIG. 4 illustrates dimensions for a thin film bridge phase change memory element as shown in FIG. 1.

FIG. 4 illustrates important dimensions of the memory cell 10. The inter-electrode path length L (x-dimension) of the active channel is defined by the thickness of the insulating member 14 (called channel dielectric in the figure) between the first electrode 12 and the second electrode 13. This length L can be controlled by controlling the width of the insulating member 14 in embodiments of the memory cell. In representative embodiments, the width of the insulating member 14 can be established using a thin film deposition technique to form a thin sidewall dielectric on the side of an electrode stack. Thus, embodiments of the memory cell have a width of the insulating member 14 and thus the path length L of less than 100 nm. Other embodiments have a path length L of about 40 nm or less. In yet other embodiments, the path length L is less than 20 nm. It will be understood that the path length L can be even smaller than 20 nm, using thin film deposition techniques such as atomic layer deposition and the like, according to the needs of the particular application.

Likewise, the bridge thickness T (y-dimension) can be very small in embodiments of the memory cell. This bridge thickness T can be established using a thin film deposition technique on the top surfaces of the first electrode 12, insulating member 14, and second electrode 13. Thus, embodiments of the memory cell have a bridge thickness T about 50 nm or less. Other embodiments of the memory cell have a bridge thickness of about 20 nm or less. In yet other embodiments, the bridge thickness T is about 10 nm or less. It will be understood that the bridge thickness T can be even smaller than 10 nm, using thin film deposition techniques such as atomic layer deposition and the like, according to the needs of the particular application, so long as the thickness is sufficient for the bridge performs its purpose as memory element, having at least two solid phases, reversible by a current or by a voltage applied across the first electrode 12 and the second electrode 13.

As illustrated in FIG. 4, the bridge width W (z-dimension) is likewise very small. This bridge width W is implemented using a damascene process in preferred embodiments, so that it has a width less than 100 nm. In some embodiments, the bridge width W is about 40 nm or less.

Embodiments of the memory cell include phase change based memory materials, including chalcogenide based materials and other materials, for the bridge 11. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb\ 100-(a+b)$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, $Pr_xSr_yMnO_3$, $ZrO_x$, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, $C_{60}$-TCNQ, TCNQ doped with other metal, or any other polymer material that has bistable or multi-stable resistance state controlled by an electrical pulse. Further examples of programmable resistive memory materials include GeSbTe, GeSb, NiO, Nb—SrTiO$_3$, Ag—GeTe, $Pr_xCa_yMnO_3$, ZnO, $Nb_2O_5$, Cr—SrTiO$_3$.

The following are short summaries describing four types of resistive memory materials. The first type is chalcogenide material, such as $Ge_xSb_yTe_z$ where x:y:z=2:2:5, or other compositions with x: 0~5; y: 0~5; z: 0~10. GeSbTe with doping, such as N—, Si—, Ti—, or other element doping is alternatively used.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimater with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

A post-deposition annealing treatment in vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

A second type of memory material suitable for use in embodiments is colossal magnetoresistance ("CMR") material, such as $Pr_xCa_yMnO_3$ where x=0.5:0.5, or other compositions with x: 0~1; y: 0~1. CMR material that includes Mn oxide is alternatively used.

An exemplary method for forming CMR material uses PVD sputtering or magnetron-sputtering method with source gases of Ar, $N_2$, $O_2$, and/or He, etc. at the pressure of 1 mTorr~100 mTorr. The deposition temperature can range from room temperature to ~600° C., depending on the post deposition treatment condition. A collimater with an aspect ratio of 1~5 can be used to improve the fill-in performance. To improve the fill-in performance, the DC bias of several tens of volts to several hundreds of volts is also used. On the other hand, the combination of DC bias and the collimater can be used simultaneously. A magnetic field of several tens of Gauss to as much as a Tesla (10,000 Gauss) may be applied to improve the magnetic crystallized phase.

A post-deposition annealing treatment in vacuum or in an $N_2$ ambient or $O_2/N_2$ mixed ambient is optionally used to improve the crystallized state of CMR material. The annealing temperature typically ranges from 400° C. to 600° C. with an anneal time of less than 2 hours.

The thickness of CMR material depends on the design of the cell structure. The CMR thickness of 10 nm to 200 nm can be used for the core material. A buffer layer of YBCO ($YBaCuO_3$, which is a type of high temperature superconductor material) is often used to improve the crystallized state of CMR material. The YBCO is deposited before the deposition of CMR material. The thickness of YBCO ranges from 30 nm to 200 nm.

A third type of memory material is two-element compounds, such as $Ni_xO_y$; $Ti_xO_y$; $Al_xO_y$; $W_xO_y$; $Zn_xO_y$; $Zr_xO_y$; $Cu_xO_y$; etc, where x:y=0.5:0.5, or other compositions with x: 0~1; y: 0~1. An exemplary formation method uses a PVD sputtering or magnetron-sputtering method with reactive gases of Ar, $N_2$, $O_2$, and/or He, etc. at the pressure of 1 mTorr~100 mTorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimater with an aspect ratio of 1~5 can be used to improve the fill-in performance. To improve the fill-in performance, the DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

An alternative formation method uses a PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mTorr~100 mTorr, using a target of metal oxide, such as Ni, Ti, Al, W, Zn, Zr, or Cu etc. The deposition is usually done at room temperature. A collimater with an aspect ratio of 1~5 can be used to improve the fill-in performance. To improve the fill-in performance, a DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

Yet another formation method uses oxidation by a high temperature oxidation system, such as a furnace or a rapid thermal pulse ("RTP") system. The temperature ranges from 200° C. to 700° C. with pure $O_2$ or $N_2/O_2$ mixed gas at a pressure of several mTorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

A fourth type of memory material is a polymer material, such as TCNQ with doping of Cu, $C_{60}$, Ag etc. or PCBM-TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of $10^{-4}$ Torr to $10^{-10}$ Torr. The wafer temperature ranges from room temperature to 200° C.

A post-deposition annealing treatment in vacuum or in an $N_2$ ambient is optionally performed to improve the composition distribution of polymer material. The annealing temperature ranges from room temperature to 300° C. with an anneal time of less than 1 hour.

Another technique for forming a layer of polymer-based memory material is to use a spin-coater with doped-TCNQ solution at a rotation of less than 1000 rpm. After spin-coating, the wafer held (typically at room temperature or temperature less than 200° C.) for a time sufficient for solid-state formation. The hold time ranges from several minutes to days, depending on the temperature and on the formation conditions.

Figure 5:
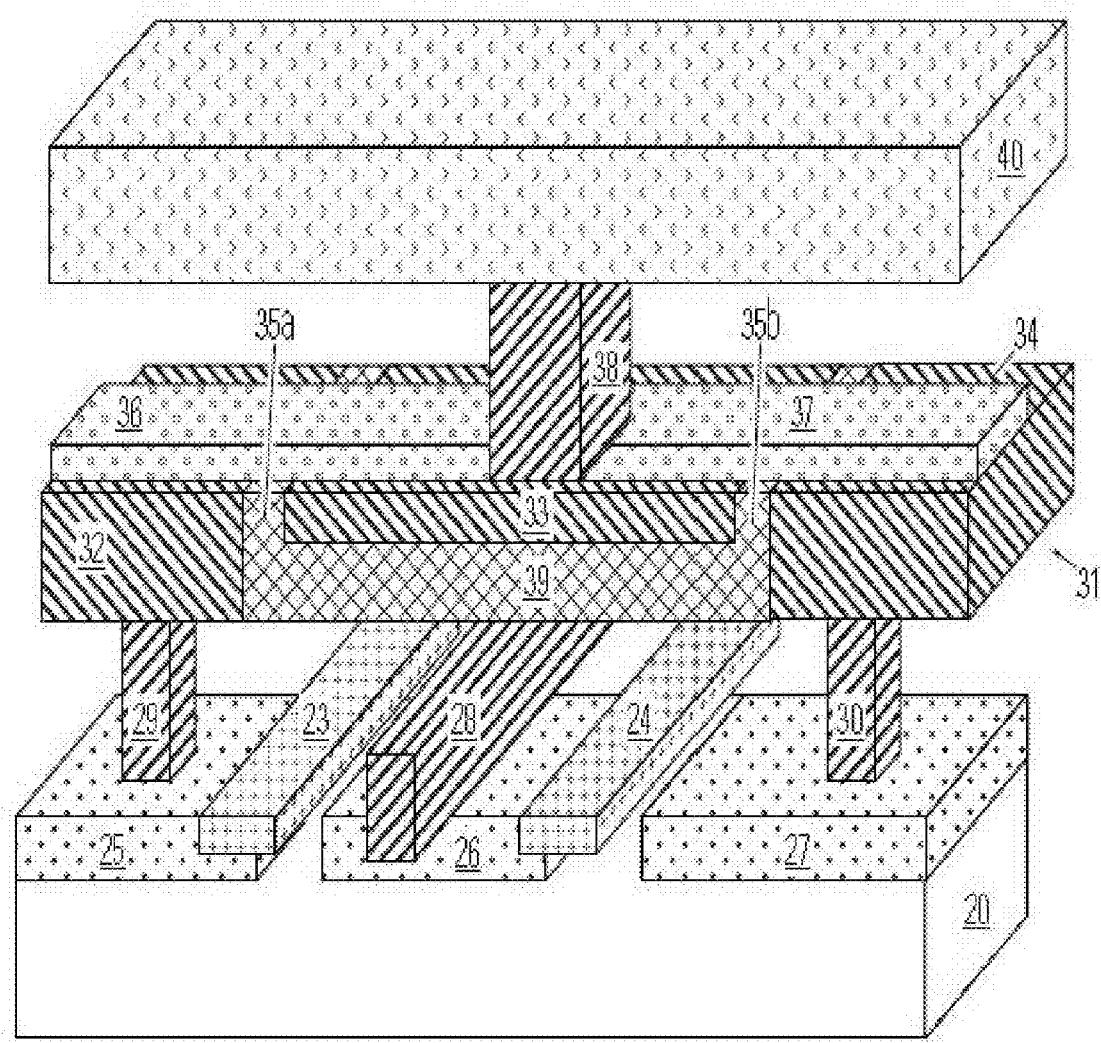
FIG. 5 illustrates a structure for a pair of phase change memory elements with access circuitry below an electrode layer and bit lines above the electrode layer.

FIG. 5 depicts a structure for PCRAM cells. The cells are formed on a semiconductor substrate 20. Isolation structures such as shallow trench isolation STI dielectrics (not shown) isolate pairs of rows of memory cell access transistors. The access transistors are formed by n-type doped region 26 acting as a common source terminal and n-type doped regions 25 and 27 acting as drain terminals in the substrate 20. Word lines 23 and 24, comprising for example polysilicon, form the gates of the access transistors. A dielectric fill layer (not shown) is formed over the word lines 23, 24. The dielectric fill layer (not shown) is patterned and conductive structures including common source line 28 and plug structures 29 and 30 are formed. The conductive material of the conductive structures can be tungsten or other materials and combinations suitable for the plug and lines structures. The common source line 28 contacts the doped region 26 and acts as a common source line along a row in the array. The plug structures 29 and 30 contact the doped regions 25 and 26, respectively. The dielectric fill layer (not shown), the common source line 28, and the plug structures 29 and 30 have a generally planar top surface which is suitable for formation of an electrode layer 31.

The electrode layer 31 includes electrode members 32, 33 and 34, which are separated from one another by insulating members 35a and 35b formed for example by a sidewall process as described below, and base member 39. The base member 39 can be thicker than the insulating members 35a, 35b in embodiments of the structure, and separates and thus reduces capacitive coupling between the electrode member 33 and the common source line 28. The base member 39 can be for example 80 to 140 nm thick, while the insulating members 35*a*, 35*b* are much narrower. The insulating members 35*a*, 35*b* comprise a thin film dielectric material on the sidewalls of electrode members 32, 34 in the illustrated embodiment, with a thickness at the surface of the electrode layer 31 determined by the thin film thickness on the sidewalls.

Damascene thin film bridges 36, 37 of memory material, such as GST, overlie the electrode layer 31, thin film bridge 36 traversing across the insulating member 35*a* and thus forming a first memory cell, and thin film bridge 37 traversing across the insulating member 35*b* and thus forming a second memory cell.

A dielectric fill layer (not illustrated) overlies the thin film bridges 36, 37. One or more layers within the dielectric fill layer are utilized in the damascene process described in more detail below. The dielectric fill layer may comprise, for example, silicon dioxide, a polyimide, silicon nitride or other dielectric fill materials. In preferred embodiments, the dielectric fill layer comprises a relatively good insulator for heat as well as for electricity, providing thermal and electrical isolation for the bridges 36, 37. Conductive plug 38, comprising for example tungsten, contacts the electrode member 33. A patterned conductive layer 40, comprising metal or other conductive material, including bit lines in an array structure, overlies the dielectric fill layer and contacts the plug 38 to establish access to the memory cells corresponding to the thin film bridge 36 and the thin film bridge 37.

Figure 6:
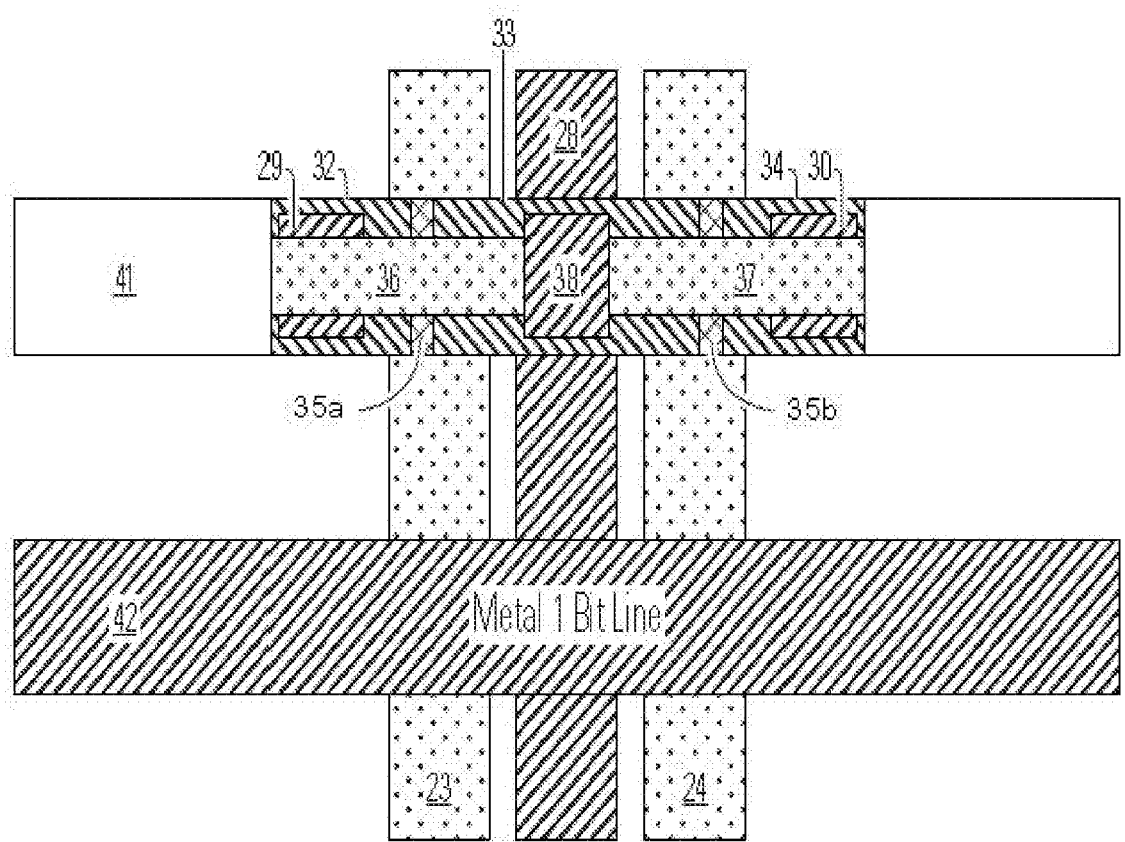
FIG. 6 shows a layout or plan view for the structure illustrated in FIG. 5.

FIG. 6 illustrates a top view (plan view) of the structures above the substrate 20 illustrated in FIG. 5. Thus, the word lines 23 and 24 are laid out substantially parallel to the common source line 28 along rows in an array of memory cells. Plugs 29 and 30 contact drain terminals of access transistors in the semiconductor substrate and the underside of electrode members 32 and 34 respectively. Thin film bridges 36 and 37 of memory material overlie the electrode members 32, 33 and 34, and the insulating members 35*a*, 35*b* separate the electrode members 32, 33, 34. Plug 38 contacts the electrode member 33 between the bridges 36 and 37 and the underside of a metal bit line 41 (transparent in FIG. 6) in the patterned conductive layer 40. Metal bit line 42 (not transparent) is also illustrated in FIG. 6 to emphasize the array layout of the structure.

In operation, access to the memory cell corresponding with bridge 36 is accomplished by applying a control signal to the word line 23, which couples the common source line 28 to the thin film bridge 36 via doped region 25, plug 29, and electrode member 32. Electrode member 33 is coupled via the contact plug 38 to a bit line in the patterned conductive layer 40. Similarly, access to the memory cell corresponding with bridge 37 is accomplished by applying a control signal to the word line 24.

It will be understood that a wide variety of materials can be utilized in implementation of the structure illustrated in FIGS. 5 and 6. For example, copper metallization can be used. Other types of metallization, including aluminum, titanium nitride, and tungsten based materials can be utilized as well. Also, non-metal conductive material such as doped polysilicon can be used. The electrode material in the illustrated embodiment is preferably TiN or TaN. Alternatively, the electrodes may be TiAlN or TaAlN, or may comprise, for further examples, one or more elements selected from the group consisting of Ti, W, Mo, Al, Ta, Cu, Pt, Ir, La, Ni, and Ru and alloys thereof. The inter-electrode fence members 35*a*, 35*b* may be silicon oxide, silicon oxynitride, silicon nitride, $Al_2O_3$, or other low K dielectrics. Alternatively, the inter-electrode insulating layer may comprise one or more elements selected from the group consisting of Si, Ti, Al, Ta, N, O, and C.

Figure 7:
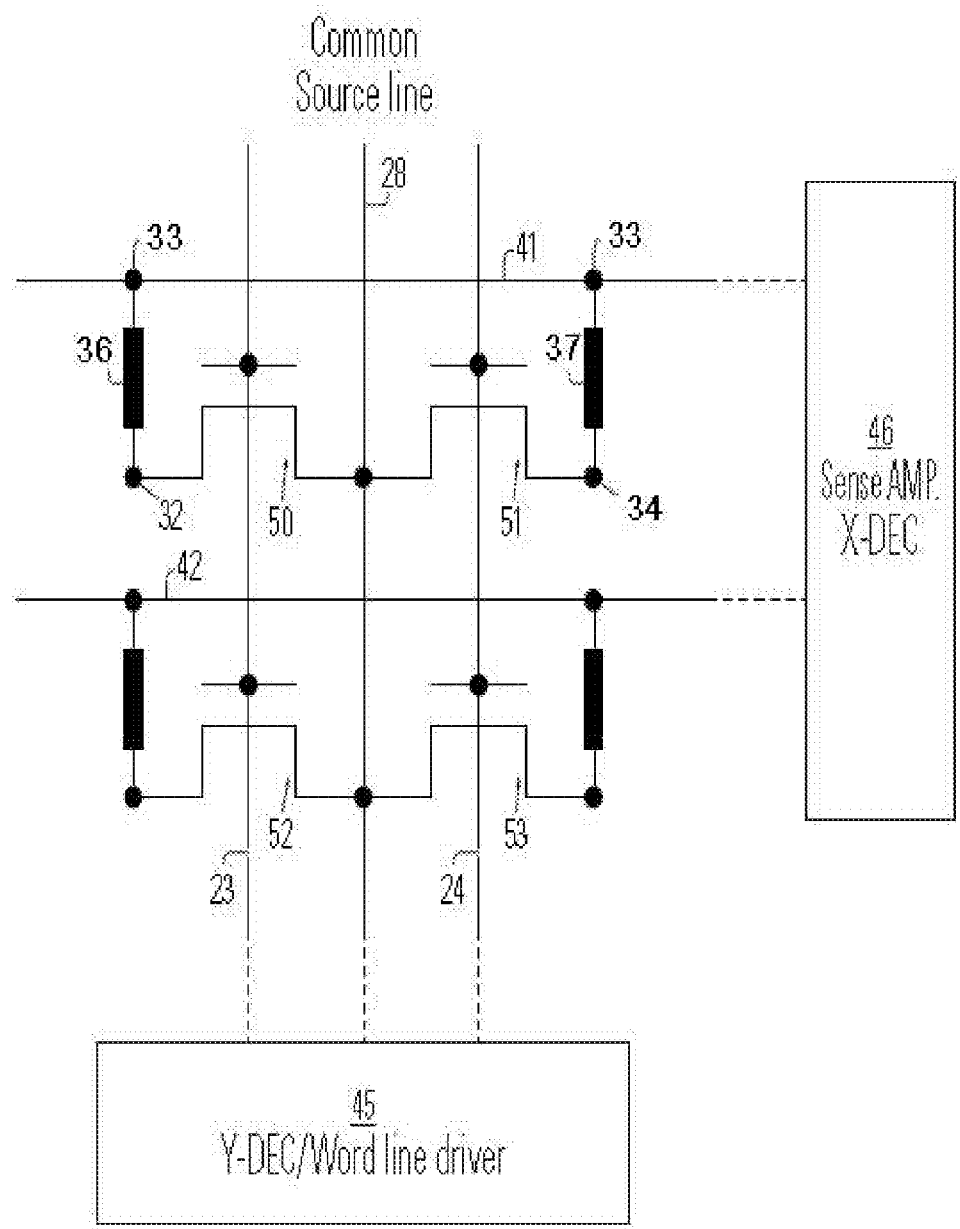
FIG. 7 is a schematic diagram for a memory array comprising phase change memory elements.

FIG. 7 is a schematic illustration of a memory array, which can be implemented as described with reference to FIGS. 5 and 6. Thus, reference numerals for elements of FIG. 7 match corresponding elements in the structure of FIGS. 5 and 6. It will be understood that the array structure illustrated in FIG. 7 can be implemented using other cell structures. In a schematic illustration of FIG. 7, the common source line 28, the word line 23 and the word line 24 are arranged generally parallel in the Y-direction. Bit lines 41 and 42 are arranged generally parallel in the X-direction. Thus, a Y-decoder and a word line driver in block 45 are coupled to the word lines 23, 24. An X-decoder and set of sense amplifiers in block 46 are coupled to the bit lines 41 and 42. The common source line 28 is coupled to the source terminals of access transistors 50, 51, 52 and 53. The gates of access transistors 50, 52 are coupled to the word line 23. The gates of access transistors 51, 53 are coupled to the word line 24. The drain of access transistor 50 is coupled to memory cell bridge 36 via the electrode member 32, which is in turn coupled to electrode member 33. Likewise, the drain of access transistor 51 is coupled to memory cell bridge 37 via the electrode member 34, which is in turn coupled to the electrode member 33. The electrode member 33 is coupled to the bit line 41. For schematic purposes, the electrode member 33 is illustrated at separate locations on the bit line 41. It will be appreciated that separate electrode members can be utilized for the separate memory cell bridges 36, 37 in other embodiments. Access transistors 52 and 53 are coupled in a similar fashion to bit line 42. It can be seen that the common source line 28 is shared by two rows of memory cells, where a row is arranged in the Y-direction in the illustrated schematic. Likewise, the electrode member 33 is shared by two memory cells in a column in the array, where a column is arranged in the X-direction in the illustrated schematic.

Figure 8:
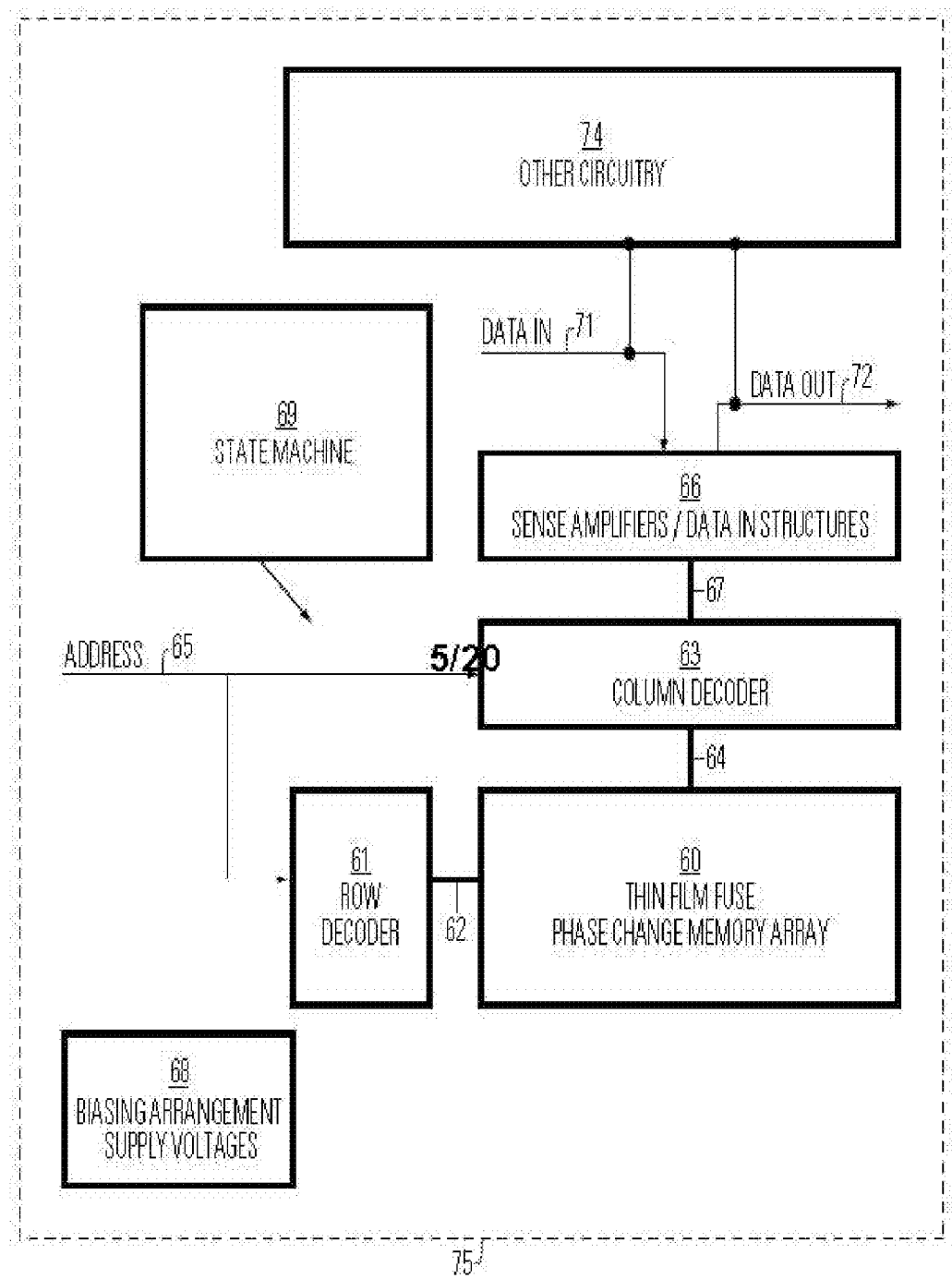
FIG. 8 is a block diagram of an integrated circuit device including a thin film fuse phase change memory array and other circuitry.

FIG. 8 is a simplified block diagram of an integrated circuit according to an embodiment of the present invention. The integrated circuit 74 includes a memory array 60 implemented using thin film fuse phase change memory cells as described herein, on a semiconductor substrate. A row decoder 61 is coupled to a plurality of word lines 62, and arranged along rows in the memory array 60. A column decoder 63 is coupled to a plurality of bit lines 64 arranged along columns in the memory array 60 for reading and programming data from the multiple-gate memory cells in the array 60. Addresses are supplied on bus 65 to column decoder 63 and row decoder 61. Sense amplifiers and data-in structures in block 66 are coupled to the column decoder 63 via data bus 67. Data is supplied via the data-in line 71 from input/output ports on the integrated circuit 75 or from other data sources internal or external to the integrated circuit 75, to the data-in structures in block 66. In the illustrated embodiment, other circuitry is included on the integrated circuit, such as a general purpose processor or special purpose application circuitry, or a combination of modules providing system-on-a-chip functionality supported by the thin film fuse phase change memory cell array. Data is supplied via the data-out line 72 from the sense amplifiers in block 66 to input/output ports on the integrated circuit 75, or to other data destinations internal or external to the integrated circuit 75.

A controller implemented in this example using bias arrangement state machine 69 controls the application of bias arrangement supply voltages 68, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 9:
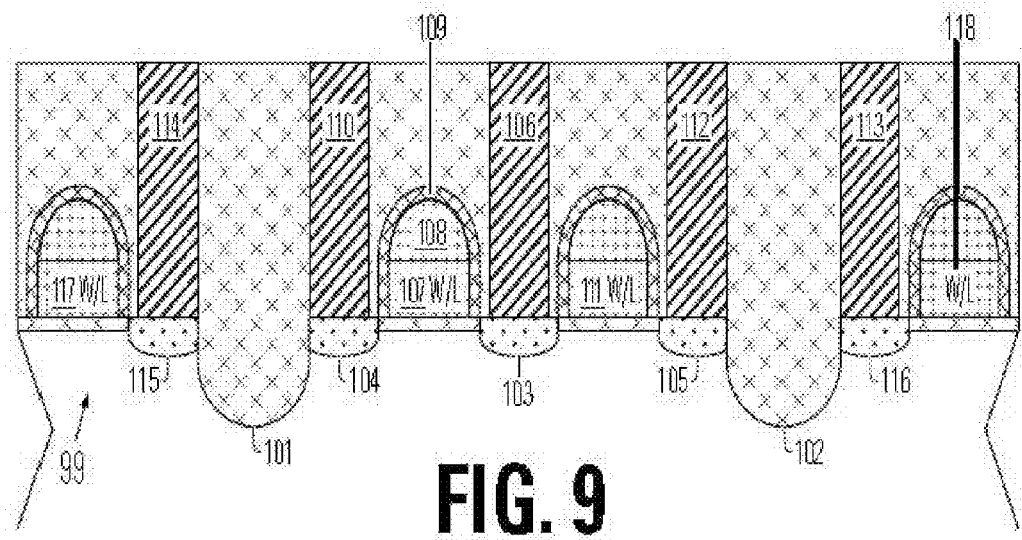
FIG. 9 is a cross-section of a substrate that includes access circuitry formed by front-end-of-line processes, made in a process for manufacturing a phase change memory device based on the structure shown in FIG. 5.

FIG. 9 illustrates a structure 99 after front-end-of-line processing, forming the standard CMOS circuitry in the illustrated embodiment corresponding to the word lines, the source line, and the access transistors in the array shown in FIG. 7. In FIG. 9, source line 106 overlies doped region 103 in the semiconductor substrate, where the doped region 103 corresponds with the source terminal of a first access transistor on the left of doped region 103 in the figure, and of a second access transistor on the right of doped region 103 in the figure. In this illustrated embodiment, the source line 106 extends from doped region 103 to the top surface of the structure 99. In other embodiments the source line 106 does not extend all the way to the top surface of the structure 99, or consists of a doped region in the substrate with or without silicide on the doped region. Doped region 104 corresponds with the drain terminal of the first access transistor. A word line including conductive line 107, comprising for example polysilicon, and conductive cap 108, comprising for example silicide, acts as the gate of the first access transistor. Dielectric layer 109 overlies the line 107 and cap 108. Conductive plug 110 contacts doped region 104, and provides a conductive path to the surface of the structure 99 for contact to a memory cell electrode as described below. The drain terminal of the second access transistor is provided by doped region 105. A word line including conductive line 111 and the conductive cap (not labeled) acts as the gate for the second access transistor. Conductive plug 112 contacts doped region 105 and provides a conductive path to the top surface of the structure 99 for contact to a memory cell electrode as described below. Isolation trenches 101 and 102 separate the two-transistor structure coupled to the plugs 110 and 112 from adjacent two-transistor structures. On the left of isolation trench 101 a word line including conductive line 117 is shown along with conductive plug 114 in contact with doped region 115. On the right of isolation trench 102 a word line including conductive line 118 is shown along with conductive plug 113 in contact with doped region 116. The structure 99 illustrated in FIG. 9 provides a substrate for formation of memory cell components, including the first and second electrodes and the bridge of memory material, as described in more detail below.

Figure 10:
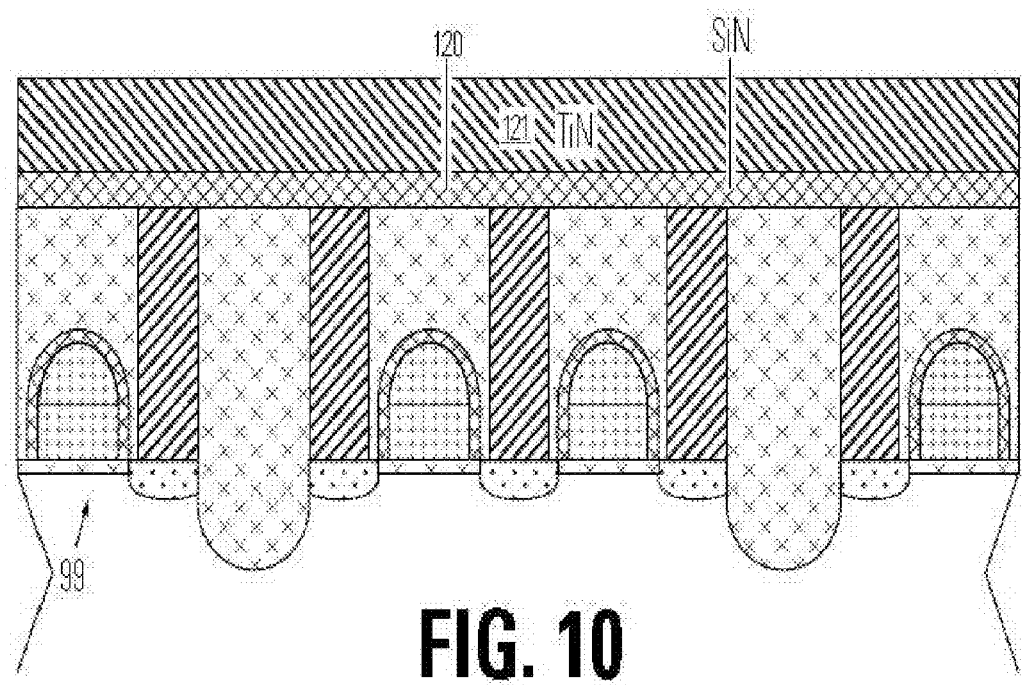
FIG. 10 is a cross-section showing initial steps in formation of an electrode layer for the structure shown in FIG. 5.

FIG. 10 illustrates a next stage in the process, in which a thin dielectric layer 120 comprising silicon nitride SiN or other material, is formed on the top surface of the structure 99. Then a layer 121 of conductive electrode material such as titanium nitride TiN is formed on the dielectric layer 120.

Figure 11A:
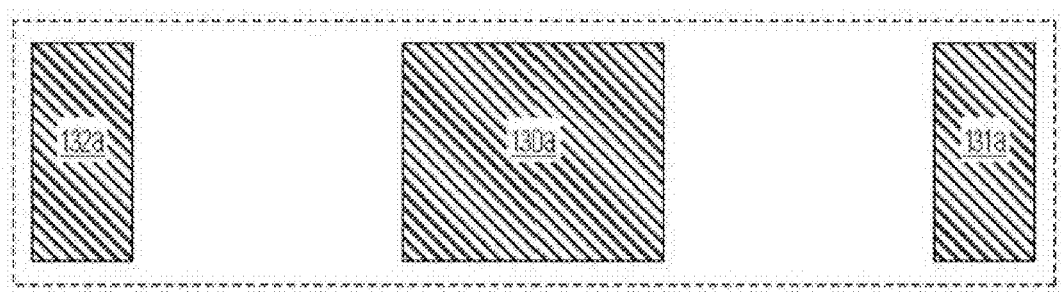
FIGS. 11A and 11B show layout and cross-sectional views for patterning the structure of FIG. 10, forming electrode stacks in the electrode layer for the structure shown in FIG. 5.
Figure 11B:
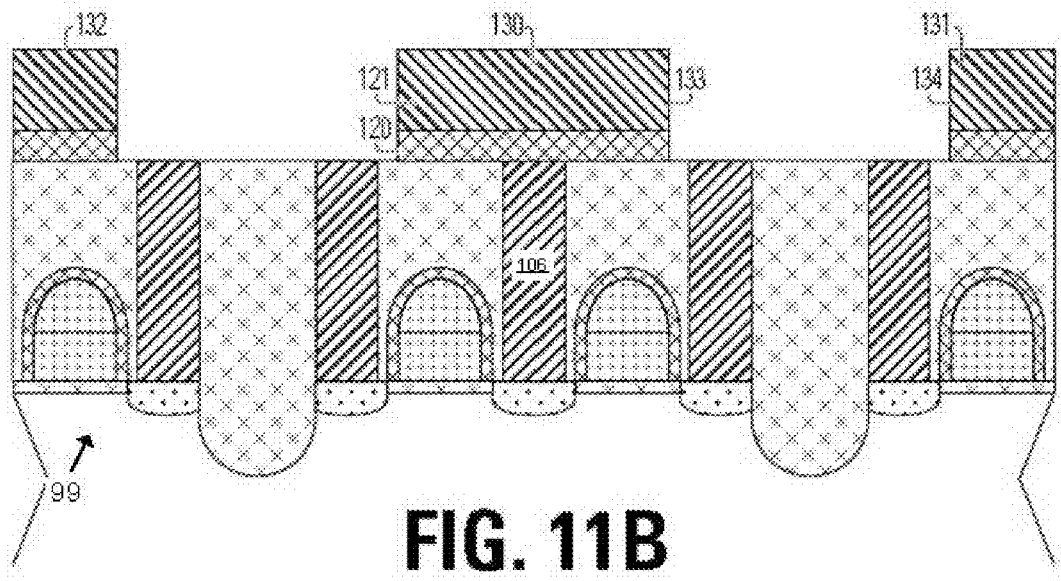

FIGS. 11A and 11B illustrate a next stage in the process, in which the conductive electrode layer 121 and the dielectric layer 120 are patterned to define electrode stacks 130, 131 and 132 on the surface of the structure 99. FIG. 11A is a top view of the structure illustrated in FIG. 11B. In an embodiment, the electrode stacks 130, 131, 132 are defined by a mask lithographic step that produces a patterned layer of photoresist, followed by dimension measurement and verification steps known in the art, and then etching of the conductive electrode layer 121 and dielectric layer 120 to form the electrode stacks 130, 131, 132 and expose the structure 99 between the stacks 130, 131, 132. The stacks 130, 131, 132 have sidewalls 133 and 134.

Figure 12:
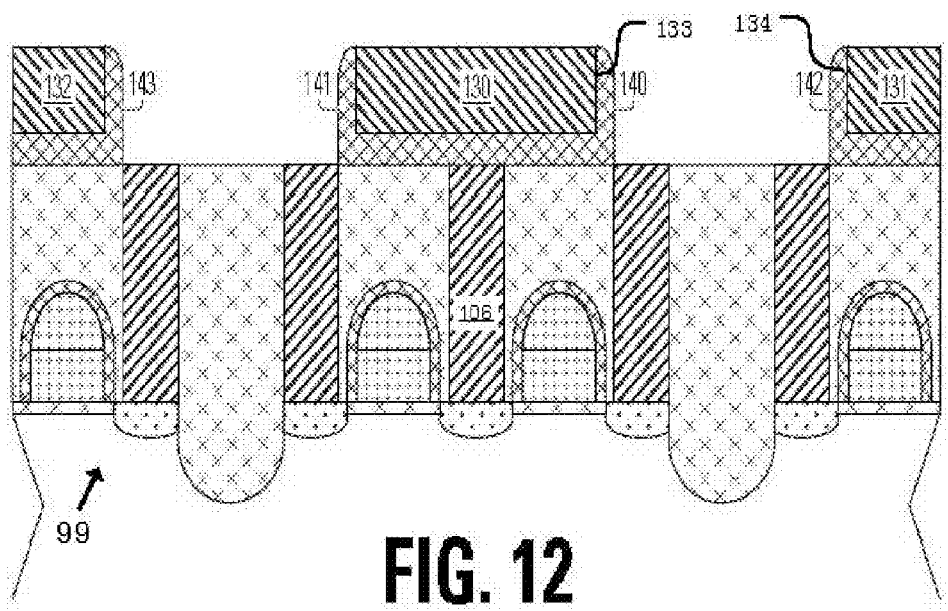
FIG. 12 shows a cross-sectional view corresponding to steps for formation of sidewall insulators on the electrode stacks of FIG. 11B.

FIG. 12 illustrates a next stage in the process, in which sidewall spacers 140, 141, 142 and 143 are formed on the sidewalls 133, 134 by forming a thin film dielectric layer (not shown) that is conformal with the stacks 130, 131, 132 and the sidewalls 133, 134, and then anisotropically etching the thin film dielectric layer to remove it from the regions between the stacks 130, 131, 132 and on the top surfaces of the stacks 130, 131, 132, while the thin film dielectric layer remaining on the sidewalls 133, 134. In embodiments of the process, the material used for formation of the sidewall spacers 140, 141, 142 and 143 comprises SiN or other dielectric material, such as silicon dioxide, silicon oxynitride, aluminum oxide, and the like.

Figure 13:
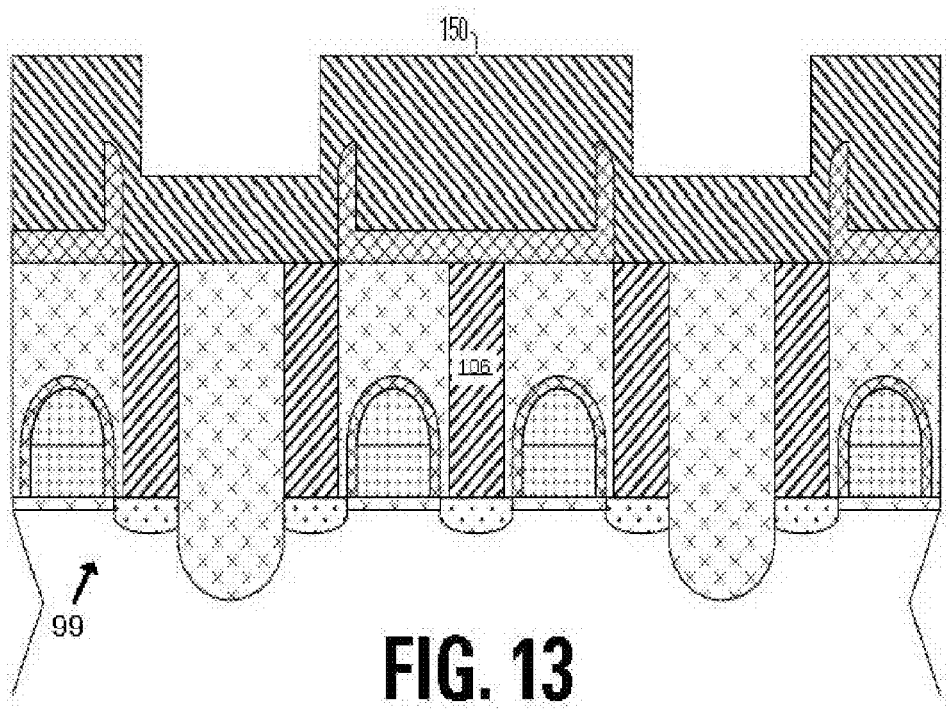
FIG. 13 shows a cross-sectional view corresponding to steps for formation of a layer of conductor material over the structure of FIG. 12.

FIG. 13 illustrates a next stage in the process, in which a second electrode material layer 150 is formed over the stacks 130, 131, 132 and the sidewalls 140, 141, 142, 143. The electrode material layer 150 comprises TiN or other suitable conductive material, such as TaN, aluminum alloys, copper alloys, doped polysilicon, etc.

Figure 14:
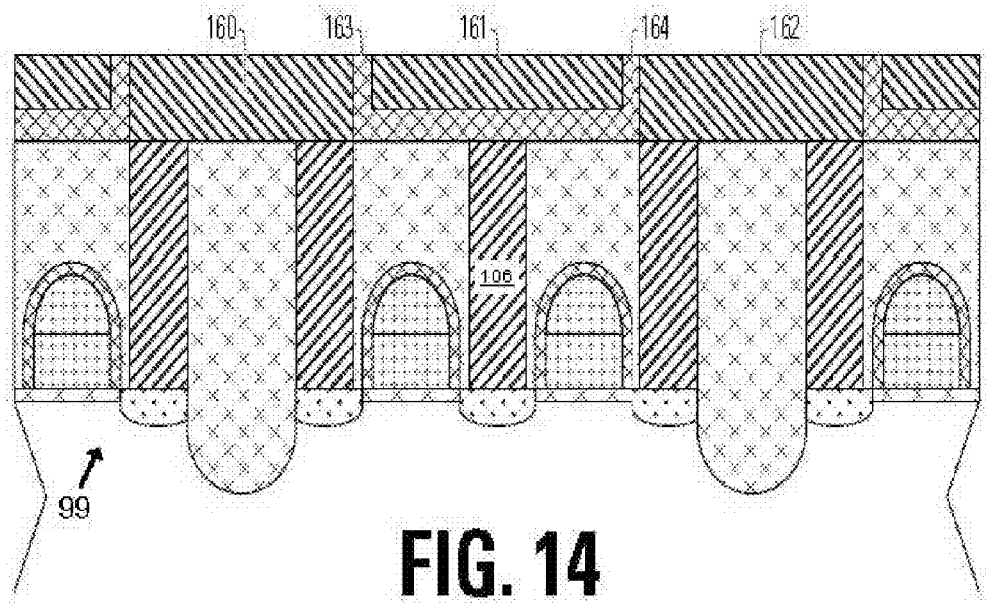
FIG. 14 shows a cross-sectional view corresponding to steps for polishing the conductive material and sidewall insulators in the structure of FIG. 13.

FIG. 14 illustrates a next stage in the process, in which the second electrode material layer 150, the sidewall spacers 140, 141, 142, 143 and the stacks 130, 131, 132 are etched and planarized to define an electrode layer over the substrate provided by structure 99. Embodiments of the process for etching and planarizing include a chemical mechanical polishing CMP process, followed by brush clean and liquid and or gas clean procedures, as known in the art. The electrode layer includes insulating members 163, 164 in between first electrode member 161 and second electrode members 160, 162. The electrode layer in the illustrated embodiment has a substantially planar top surface. As can be seen in FIG. 14, the electrode members 160, 161, 162 and insulating members 163, 164 are exposed on the top surface of the electrode layer. In the illustrated embodiment, the insulating members 163, 164 comprise portions of a dielectric structure which also extends beneath electrode member 161, isolating electrode member 161 from the source line 106. Other example structures may use different materials for the electrode members 160, 161, 162 and insulating members 163, 164.

Figure 15A:
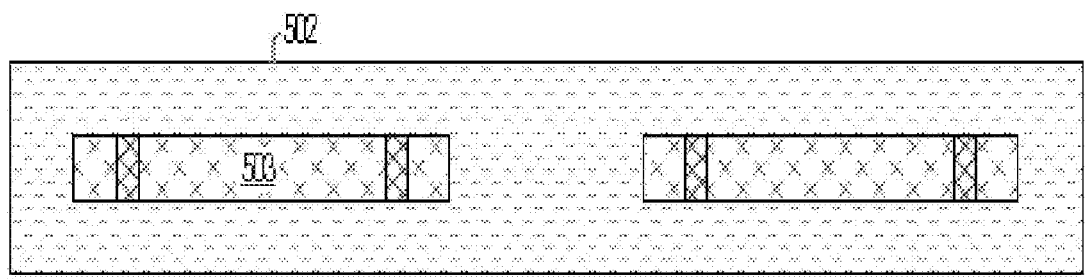
FIGS. 15A-15B illustrate a first step in a set of steps for manufacturing a bridge of memory material using a damascene procedure.
Figure 15B:
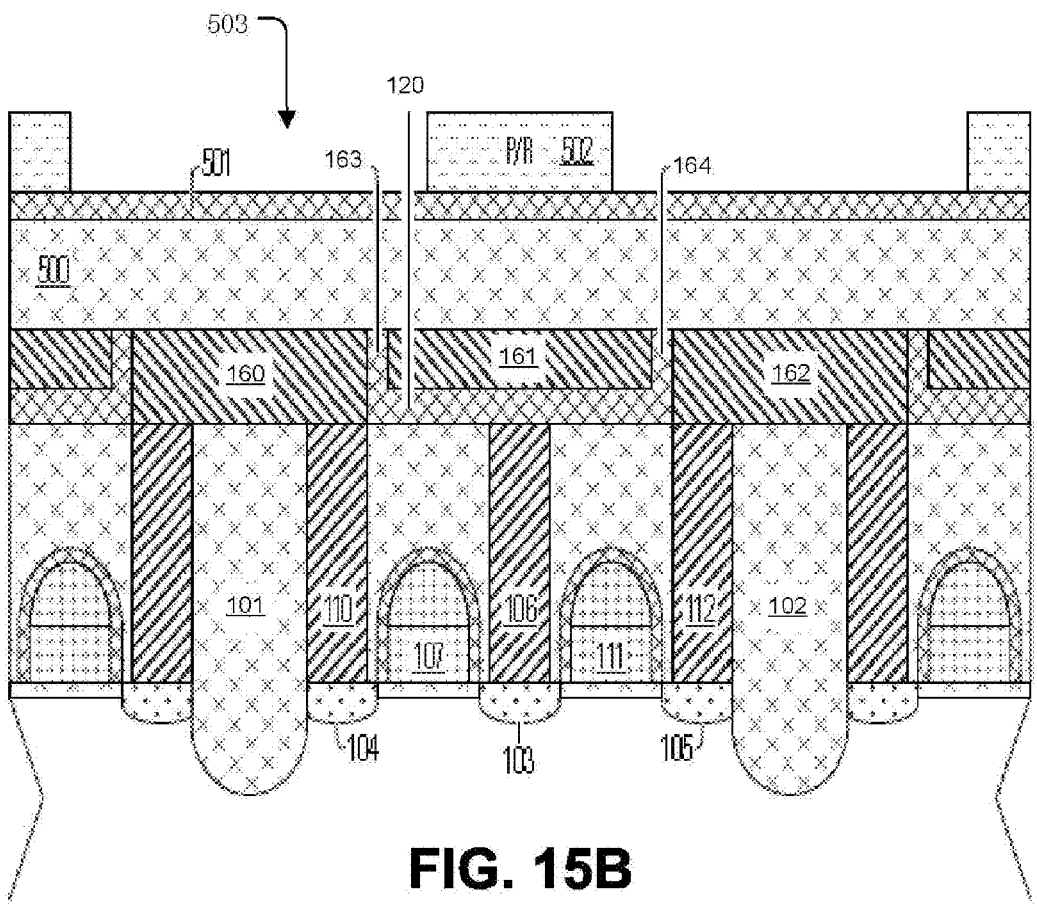
Figure 27:
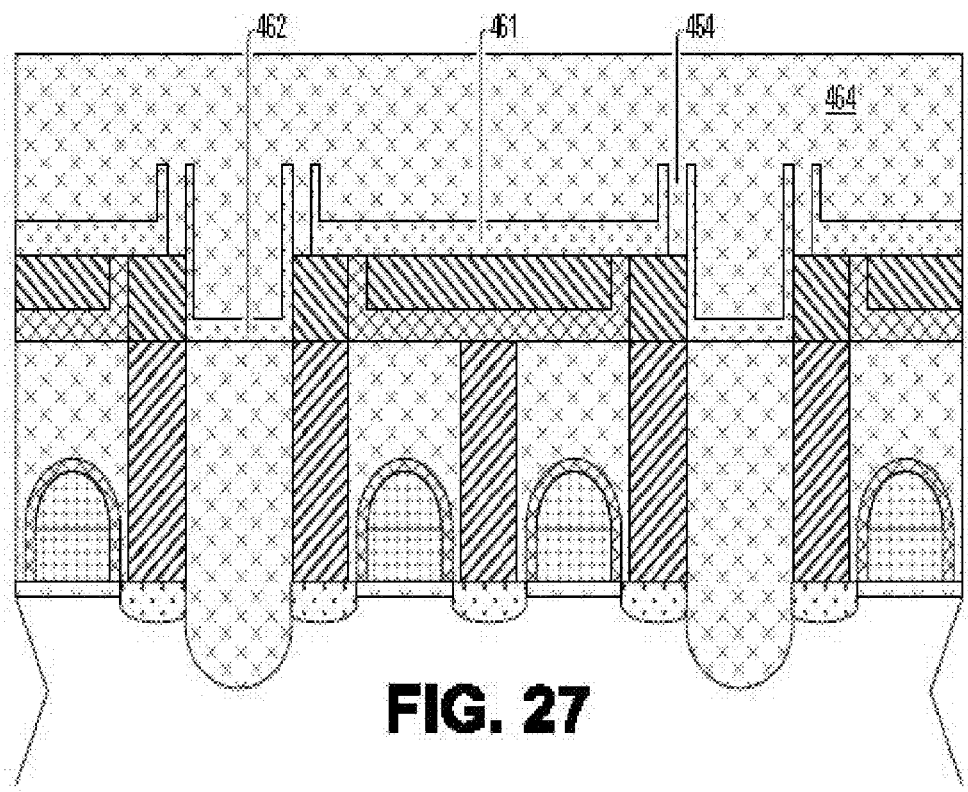
FIG. 27 illustrates a seventh step in a set of steps for manufacturing a bridge of memory material using an alternative damascene procedure.

FIGS. 15A-15B through FIG. 27 illustrate alternative damascene procedures for implementing the bridge of memory material over the electrode layer illustrated in FIG. 14, which are based on damascene techniques, that can prevent exposure of the memory material to photoresist and photoresist stripping processes. A first damascene technique is illustrated with the procedure beginning at FIGS. 15A-15B. FIGS. 15A-15B show the structure of FIG. 14, which comprises the front-end-of-line structures (101-107, 110-112 are labeled) and the electrode layer including a first electrode member 161, the second electrode member 160 on the left, and the second electrode member 162 on the right, which extend in parallel in strips perpendicular to the page, as described in detail above. According to a first embodiment of the damascene technique, a layer 500 of dielectric such as silicon dioxide is formed over the electrode layer, and cap layer 501 such as silicon nitride is formed over the layer 500. Photoresist 502 is applied and patterned to define locations 503 for trenches to subsequently be etched in the layers 500, 501, locations 503 exposing the surface of portions of the cap layer 501 and overlying the insulating members 163, 164.

Figure 16A:
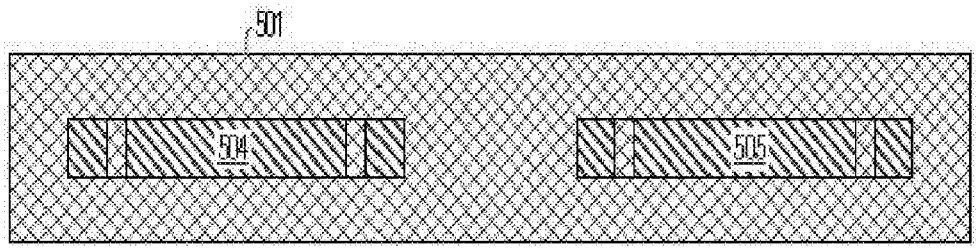
FIGS. 16A-16B illustrate a second step in a set of steps for manufacturing a bridge of memory material using a damascene procedure.
Figure 16B:
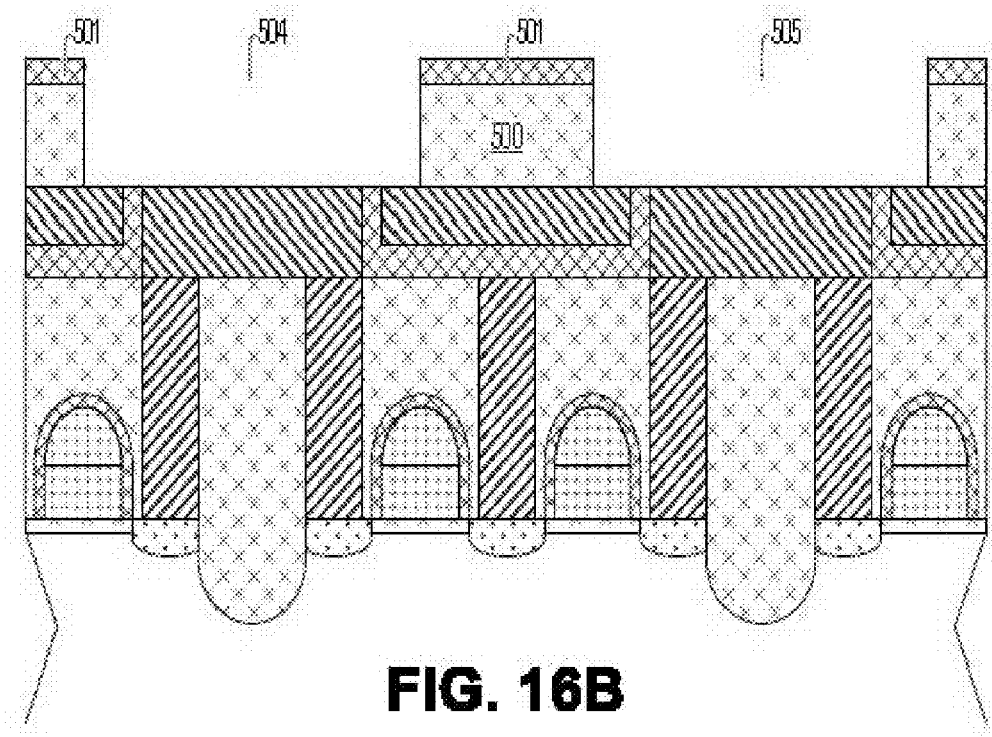

In the next step illustrated by FIGS. 16A-16B, the layers 500 and 501 are etched and the photoresist 502 is stripped, leaving trenches 504, 505 in the layers 500, 501 extending to the surface of the electrode layer.

Figure 17:
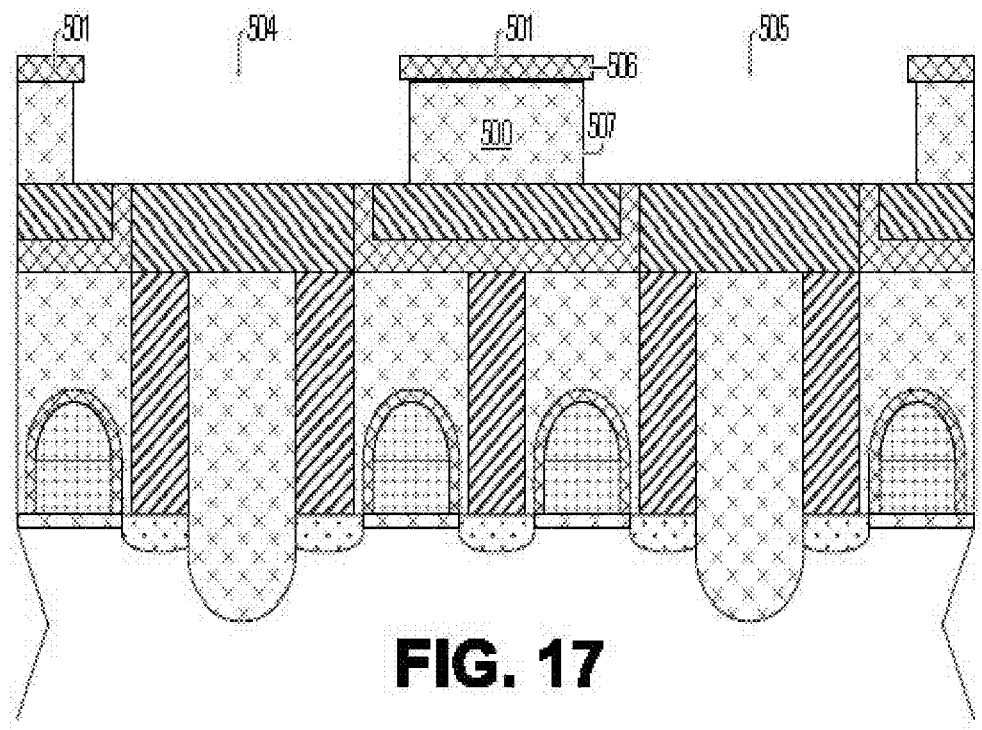
FIG. 17 illustrates a third step in a set of steps for manufacturing a bridge of memory material using a damascene procedure.
Figure 18:
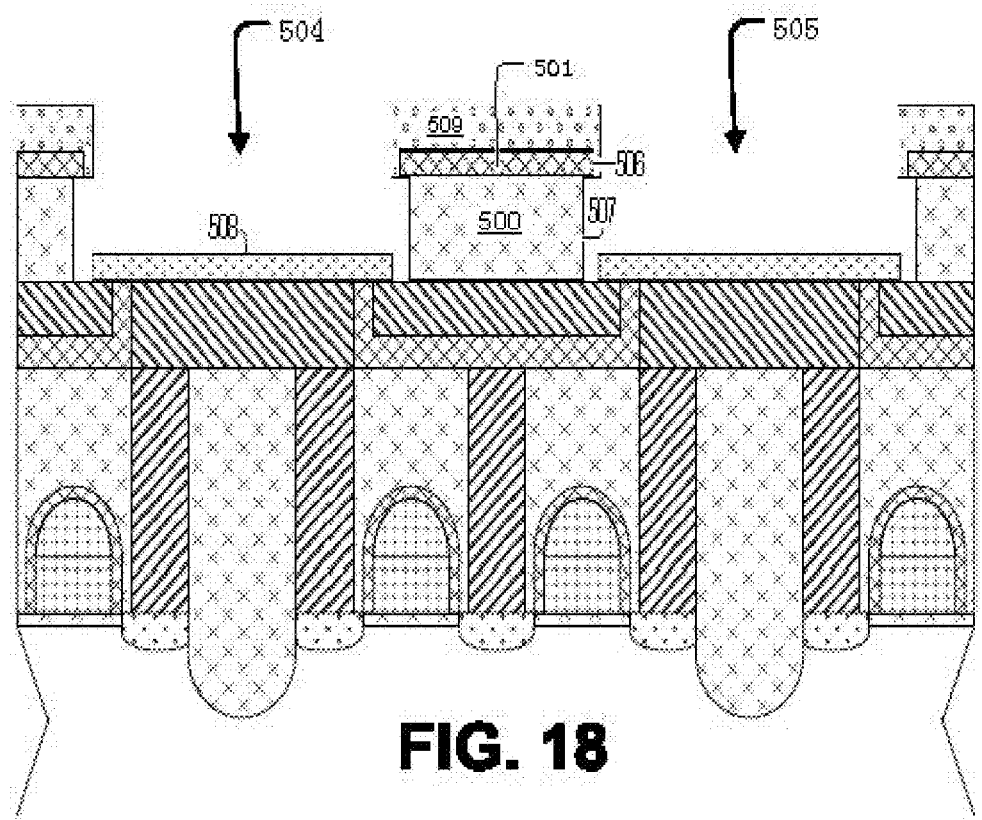
FIG. 18 illustrates a fourth step in a set of steps for manufacturing a bridge of memory material using a damascene procedure.

Next, as shown in FIG. 17, the structure of FIG. 16B is etched in a manner that is selective to the dielectric layer 500, leaving overhangs 506 of the cap layer 501 over sidewalls 507 of the dielectric layer 500. The selective etching of layer 500, comprising for example silicon dioxide, with layer 501, comprising for example silicon nitride, can comprise dipping in a solution of dilute or buffered HF, for example. Next, as shown in FIG. 18, a layer of memory material is deposited over the structure of FIG. 17, thereby forming strips 508 of memory material in the bottom of the trenches 504, 505 and forming layer 509 of memory material on top of the cap layer 501. The layer of memory material does not form on the side walls 507 of the dielectric layer 500 because of the overhang 506.

In a next set of steps, a dielectric fill is applied using for example the same material as used for layer 500, the dielectric fill covering the strips 508 of memory material and filling the trenches 504, 505. Then the structure is etched and planarized using for example CMP to remove the layer 509 and the cap layer 501, thus forming a layer of dielectric 512 over the strips 508 of memory material, as shown in FIG. 19.

Figures 28A, 28B:
FIGS. 28A-28B illustrate a seventh step in a set of steps for manufacturing a bridge of memory material using a damascene procedure.

FIGS. 20A-20B illustrate a next step, in which a photoresist layer is applied over the dielectric layer 512 and patterned to form mask 520 to define the layout of the first electrodes 514, the second electrodes 515, 516 and bridges 511, 513 of memory material. The dielectric layer 512, the strips 508 of memory material, and the second electrode members 160, 162 are etched down to the isolation structures 101, 102 according to the pattern of the photoresist mask 520, thereby forming trenches 510. Subsequent processes are applied to fill the trenches 510, form contacts to the first electrode 514, forming a patterned conductive layer 570 overlying the structure, and forming contacts 550 between the first electrode 514 and the patterned conductive layer 570, resulting in the structure illustrated in FIGS. 28A-28B.

FIG. 21 illustrates a beginning step of an alternative damascene technique for forming the bridges of memory material. The process starts after formation of the front-end-of-line structures (101-107, 110-112 are labeled) and the electrode layer including a first electrode member 161, the second electrode member 160 on the left, and the second electrode member 162 on the right, which extend in parallel in strips perpendicular to the page, as described in detail above. In this alternative technique, a film of sacrificial material 450 comprising polysilicon or other material is deposited over the electrode layer.

As shown in FIGS. 22A-22B, a layer of photoresist is applied and patterned to define masks 451 which overlie the positions of the electrode structures to be formed from the electrode members 160, 161, 162, mask 451 defining a pattern for sacrificial patches to be formed from the film of sacrificial material 450. The mask 451 is then trimmed, for example by isotopically etching, to form narrower mask structures 452 as illustrated in FIGS. 23A-23B.

Figure 24A:
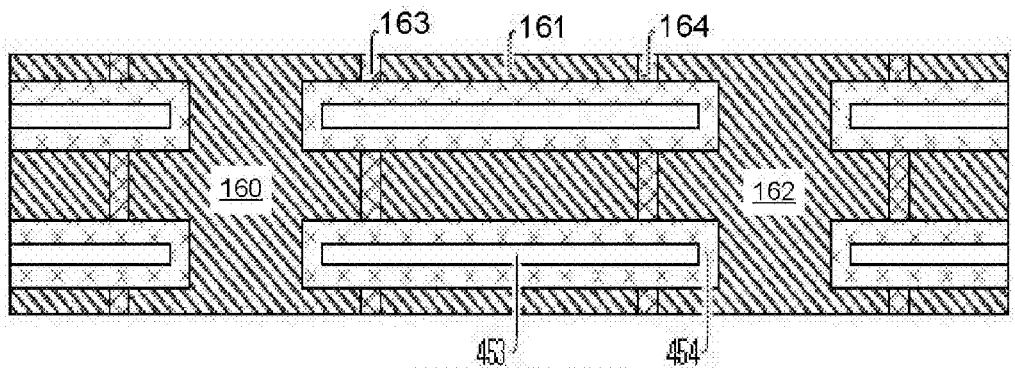
FIGS. 24A-24B illustrate a fourth step in a set of steps for manufacturing a bridge of memory material using an alternative damascene procedure.
Figure 24B:
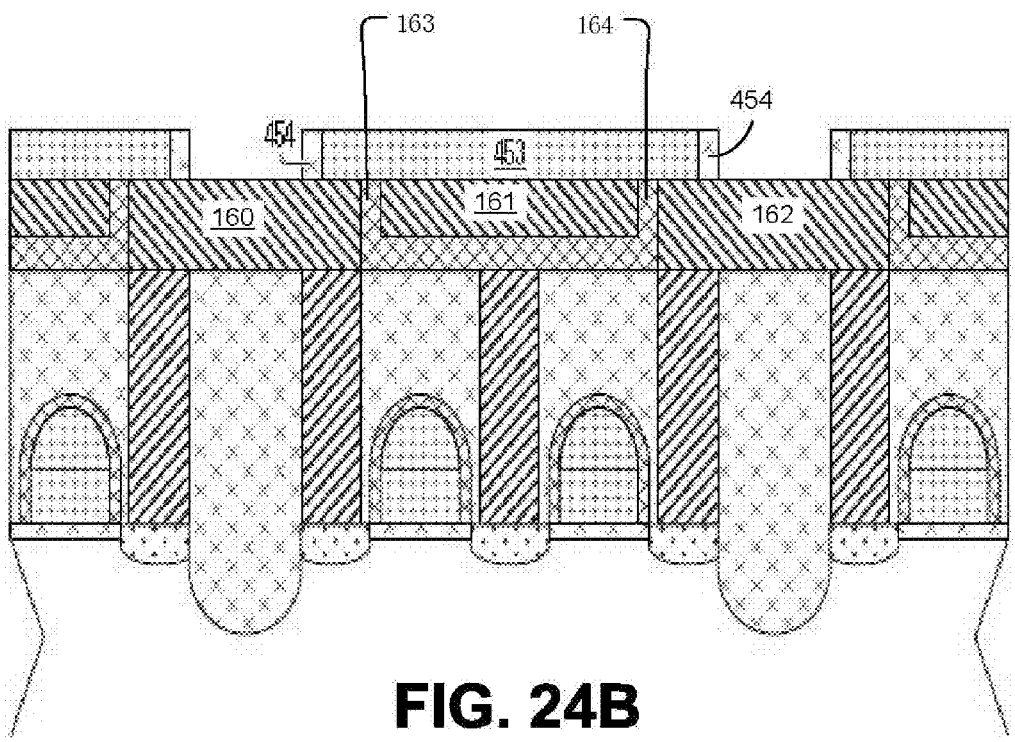

The narrower mask structures 452 are then used as an etch mask to define narrow sacrificial patches 453 of the sacrificial material over the electrode layer, and sidewall structures 454 are formed on the sacrificial patches 453, as shown in FIGS. 24A-24B. The sidewall structures 454 and the sacrificial patches 453 acts as an etch mask for the electrode structures in the electrode layer, that includes the electrode members 160, 161, 162 and the insulating members 163, 164.

Figure 25A:
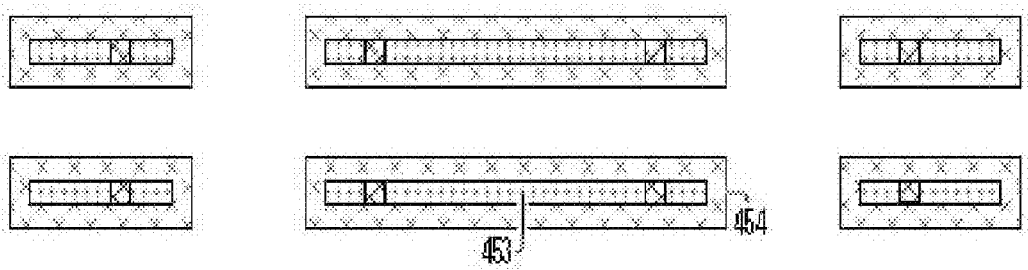
FIGS. 25A-25B illustrate a fifth step in a set of steps for manufacturing a bridge of memory material using an alternative damascene procedure.
Figure 25B:
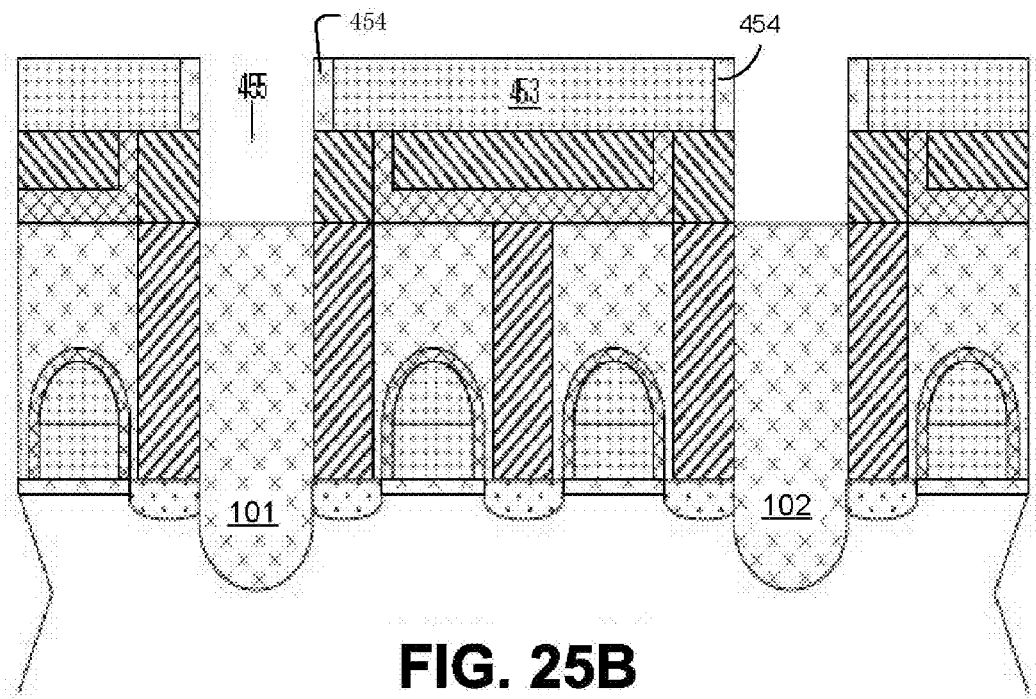
Figure 26:
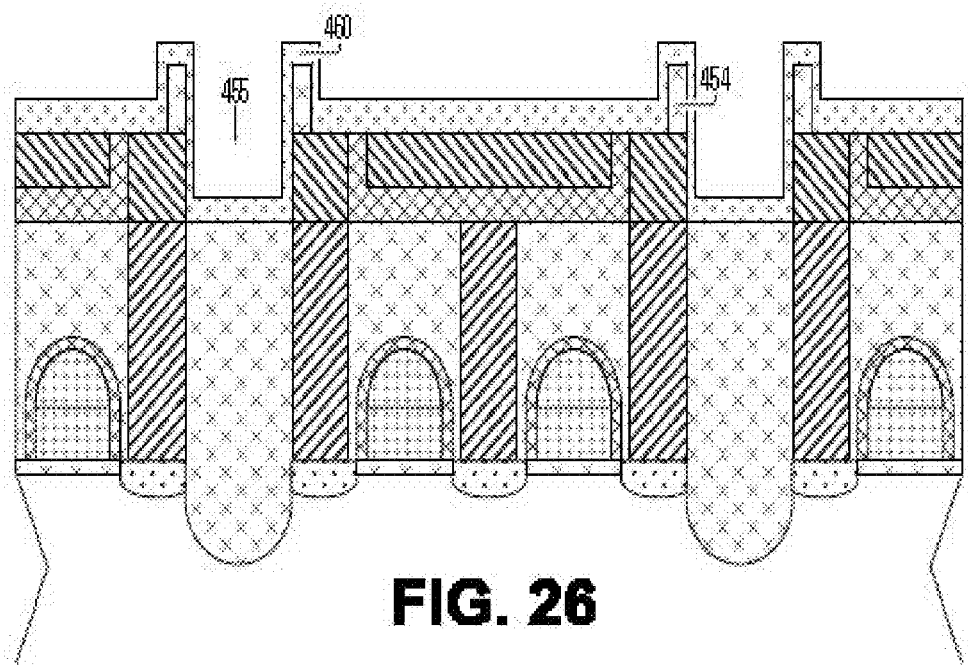
FIG. 26 illustrates a sixth step in a set of steps for manufacturing a bridge of memory material using an alternative damascene procedure.

FIGS. 25A-25B showed a result of etching the electrode layer using the etch masks formed by the sacrificial patches 453 and sidewall structures 454, resulting in trenches 455 down to the isolation structures 101, 102, and isolating the electrode structures. Following the etch, the patches 453 of sacrificial material are selectively removed, thereby leaving trenches defined by the sidewall structures 454. Next a layer 460 of memory material is formed, layer 460 covering the sidewall structures 454 and filling in the trenches 455 and the trenches defined by the sidewall structures 454 in a damascene manner, as shown in FIG. 26. Next, a dielectric fill is applied using for example silicon dioxide, covering the layer 460 of memory material and filling the trenches 455. Then the structure is etched and planarized using for example CMP, thereby removing the dielectric fill and the portions of the layer 460 on top of the sidewall structures 454, to separate the layer 460 into separate elements including bridges 461 and portions 462 of memory material in the trenches 455.

As shown in FIG. 27, another dielectric fill 464 is applied and planarized to form a structure, which is ready for procedures to form vias, contact plugs and metallization as described above.

Most phase change memory cells known to applicant are made by forming a small pore filled with phase change material, and top and bottom electrodes contacting the phase change material. The small pore structure is used to reduce the programming current. This invention reduces programming current without formation of the small pore, resulting in better process control. Furthermore, there are no top electrodes on the cell, avoiding some possible damage of the phase change material from processes used to form the top electrode.

A cell described herein comprises two bottom electrodes with a dielectric spacer in between and a damascene bridge of phase change material on the top of the electrodes spanning across the spacer. The bottom electrodes and dielectric spacer are formed in an electrode layer over front-end-of-line CMOS logic structures or other function circuit structures, providing a structure that easily support embedded memory and function circuits on a single chip, such as chips referred to as system on a chip SOC devices.

Advantages of an embodiment described herein include that the phase change happens on the center of the bridge over the dielectric spacer, rather than on the interface with an electrode, providing better reliability. Also, the current used in reset and programming is confined in a small volume allowing high current density and resultant local heating at lower reset current levels and lower reset power levels. The structure in embodiments described herein allows two dimensions of the cell to be defined by thin film thickness, achieving better process control at nanometer scales, while only one dimension of the cell can be defined by a damascene process.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

What is claimed is:

1. A method for manufacturing a memory device, comprising:
  forming an electrode layer having a top surface, the electrode layer including a first electrode member and a second electrode member and an insulating member between the first and second electrode members, such that the first and second electrode members and the insulating member extend to the top surface of the electrode layer, the insulating member having a width between the first and second electrode members at the top surface;
  forming a trench in a film of material on the electrode layer, wherein the trench extends over the insulating member between the first and second electrode members;
  depositing a layer of memory material in the trench to form a damascene patch of memory material on the top surface of the electrode layer across the insulating member, the damascene patch comprising a film of memory material having a first side and a second side and contacting the first and second electrode members on the first side, the patch defining an inter-electrode path between the first and second electrodes across the insulating member, the inter-electrode path having a path length defined by the width of the insulating member, wherein the memory material has at least two solid phases; and forming a patterned conductive layer electrically coupled to the first electrode member and arranged so that the patch and the first electrode member are in electrical series between the second electrode member and the patterned conductive layer.

2. The method of claim 1, wherein said forming a trench comprises:
forming a film of sacrificial material on the top surface of the electrode layer across the insulating member;
applying a first etch mask over the film of sacrificial material, the first etch mask defining a pattern for a sacrificial patch to be formed from the film of sacrificial material;
trimming the first etch mask to form a trimmed etch mask, the trimmed etch mask defining a more narrow pattern for the sacrificial patch;
etching the film of sacrificial material according to the trimmed etch mask to form the sacrificial patch on the electrode layer;
forming sidewall structures on the sacrificial patch to form a second etch mask defining a pattern for a first electrode and a second electrode to be formed from the first and second electrode members;
selectively etching the electrode layer according to the second etch mask to form the first and second electrodes aligned with the sacrificial patch;
selectively removing the sacrificial patch, leaving the trench defined by the sidewall structures.

3. The method of claim 1, wherein said forming a trench comprises:
forming a layer of dielectric over the electrode layer; and
etching the trench in the layer of dielectric.

4. A method for manufacturing a memory device, comprising:
forming an electrode layer having a top surface, the electrode layer including a first electrode member and a second electrode member and an insulating member between the first and second electrode members, such that the first and second electrode members and the insulating member extend to the top surface of the electrode layer, the insulating member having a width between the first and second electrode members at the top surface;
forming a film of sacrificial material on the top surface of the electrode layer across the insulating member;
applying a first etch mask over the film of sacrificial material, the first etch mask defining a pattern for a sacrificial patch to be formed from the film of sacrificial material;
trimming the first etch mask to form a trimmed etch mask, the trimmed etch mask defining a more narrow pattern for the sacrificial patch;
etching the film of sacrificial material according to the trimmed etch mask to form the sacrificial patch on the electrode layer;
forming sidewall structures on the sacrificial patch to form a second etch mask defining a pattern for a first electrode and a second electrode to be formed from the first and second electrode members;
selectively etching the electrode layer according to the second etch mask to form the first and second electrodes aligned with the sacrificial patch;
selectively removing the sacrificial patch, leaving a trench defined by remaining sidewall structures;

depositing a layer of memory material in the trench aligned with the first and second electrodes, to form a damascene patch of memory material on the top surface of the electrode layer across the insulating member, the damascene patch comprising a film of memory material having a first side and a second side and contacting the first and second electrodes on the first side, the patch defining an inter-electrode path between the first and second electrodes across the insulating member, the inter-electrode path having a path length defined by the width of the insulating member, wherein the memory material has at least two solid phases.

5. The method of claim 4, wherein the width of the insulating member is less than 100 nm, said damascene patch has a thickness less than 100 nm in a dimension orthogonal to the top surface of the electrode layer.

6. The method of claim 4, wherein said damascene patch has a thickness less than 20 nm in a dimension orthogonal to the top surface of the electrode layer.

7. The method of claim 4, wherein said forming an electrode layer includes:
forming a dielectric layer on a substrate;
forming a first conductive layer on the dielectric layer;
etching a pattern in the first conductive layer to define stacks including portions of the dielectric layer and the first conductive layer, the pattern including regions between the stacks exposing the substrate, the stacks having sidewalls;
forming a sidewall dielectric layer over the stacks and etching the sidewall dielectric layer to form sidewall spacers on the sidewalls of the stacks;
forming a second conductive layer on the sidewall spacers, the stacks, and the regions between the stacks;
etching and planarizing the second conductive layer to define the electrode layer, such that the sidewall spacers are exposed on the top surface and act as the insulating member, portions of the first conductive layer in the stacks are exposed on the top surface and act as the first electrode, and portions of the second conductive layer in the regions between the stacks are exposed on the top surface and act as the second electrode.

8. The method of claim 7, wherein said etching and planarizing comprises chemical mechanical polishing.

9. The method of claim 4, including forming said electrode layer on a surface of a substrate, the substrate comprising circuitry for accessing the memory cell, including a contact on the surface of the substrate, and said second electrode in the electrode layer is coupled to the contact.

10. The method of claim 4, including forming a patterned conductive layer over said damascene patch, and forming a contact between said first electrode and said patterned conductive layer.

11. The method of claim 4, wherein the memory material comprises an alloy including a combination of Ge, Sb, and Te.

12. The method of claim 4, wherein the memory material comprises an alloy including a combination of two or more materials from the group of Ge, Sb, Te, Se, In, Ti, Ga, Bi, Sn, Cu, Pd, Pb, Ag, S, and Au.

13. A method for manufacturing a memory device, comprising:
forming circuitry in a substrate having a top surface, the circuitry including an array of contacts on the top surface of the substrate;
forming an electrode layer on the substrate, the electrode layer having a top surface, the electrode layer including an array of electrode pairs, the electrode pairs including respective first electrodes and second electrodes and respective insulating members between the first and second electrodes, wherein the second electrodes contact corresponding contacts in the array of contacts, and wherein the first and second electrodes and the insulating members extend to the top surface of the electrode layer, and the insulating members have widths between the first and second electrodes at the top surface;

forming a layer of dielectric over the electrode layer;

etching an array of trenches in the layer of dielectric;

depositing a layer of memory material in the trenches in the array of trenches, to form an array of damascene patches of memory material on the top surface of the electrode layer, the array of damascene patches including patches for each of the electrode pairs in the array of electrode pairs, the damascene patches contacting the respective first and second electrodes and extending across the respective insulating members, the damascene patches comprising films of memory material having a first side and a second side and contacting the respective first and second electrodes on the first side, the damascene patches defining inter-electrode paths between the first and second electrodes across the insulating members, the inter-electrode paths having path lengths defined by the widths of the insulating members, wherein the memory material has at least two solid phases; and forming a patterned conductive layer over said patches, and forming an array of contacts between said first electrodes in the array of electrode pairs and said patterned conductive layer so that respective patches and the corresponding first electrode are in electrical series between the corresponding second electrode and said patterned conductive layer.

14. The method of claim 13, wherein the width of at least one insulating member in the array of electrode pairs is less than 50 nm, and said damascene patches have thicknesses less than 50 nm in a dimension orthogonal to the top surface of the electrode layer.

15. The method of claim 13, wherein said forming an electrode layer includes:

forming a dielectric layer on a substrate;

forming a first conductive layer on the dielectric layer;

etching a pattern in the first conductive layer including an array of stacks including portions of the dielectric layer and the first conductive layer, the pattern including regions between the stacks exposing the substrate, the stacks having sidewalls;

forming a sidewall dielectric layer over the array of stacks and etching the sidewall dielectric layer to form sidewall spacers on the sidewalls of the stacks in the array of stacks;

forming a second conductive layer over the regions between the stacks, the sidewall spacers and the stacks;

etching and planarizing the second conductive layer to define the electrode layer, wherein the sidewall spacers are exposed on the top surface and act as the insulating members, portions of the first conductive layer in the stacks are exposed on the top surface and act as the first electrodes, and portions of the second conductive layer in the regions between the stacks are exposed on the top surface and act as the second electrodes.

16. The method of claim 15, wherein said performing said etching and planarizing comprises chemical mechanical polishing.

17. The method of claim 13, wherein said circuitry includes a plurality of word lines and isolation devices controlled by signals on the plurality of word lines, and said patterned conductive layer comprises a plurality of bit lines.

18. The method of claim 13, wherein two electrode pairs in said array of electrode pairs comprise conductive members arranged in a row, including a first conductive member acting as a second electrode in a first of the two electrode pairs, a second conductive member acting as first electrodes in both of the two electrode pairs, and a third conductive member acting as a second electrode in a second of the two electrode pairs.

19. The method of claim 13, wherein the memory material comprises an alloy including a combination of Ge, Sb, and Te.

20. The method of claim 13, wherein the memory material comprises an alloy including a combination of two or more materials from the group of Ge, Sb, Te, Se, In, Ti, Ga, Bi, Sn, Cu, Pd, Pb, Ag, S, and Au.

* * * * *